(12) United States Patent
Itoh et al.

(10) Patent No.: US 9,233,420 B2
(45) Date of Patent: Jan. 12, 2016

(54) FINE METAL PARTICLES AND FINE METAL OXIDE PARTICLES IN DRY POWDER FORM, AND USE THEREOF

(71) Applicant: HARIMA CHEMICALS, INC., Kakogawa-shi (JP)

(72) Inventors: Daisuke Itoh, Tsukuba (JP); Masayuki Ueda, Tsukuba (JP); Noriaki Hata, Tsukuba (JP); Yorishige Matsuba, Tsukuba (JP)

(73) Assignee: HARIMA CHEMICALS, INC., Kakogawa-Shi (JP)

( * ) Notice: Subject to any disclaimer, the term of this patent is extended or adjusted under 35 U.S.C. 154(b) by 168 days.

(21) Appl. No.: 14/158,620

(22) Filed: Jan. 17, 2014

(65) Prior Publication Data

US 2014/0178581 A1    Jun. 26, 2014

Related U.S. Application Data

(62) Division of application No. 10/595,440, filed as application No. PCT/JP2004/015475 on Oct. 20, 2004, now Pat. No. 8,758,475.

(30) Foreign Application Priority Data

Oct. 20, 2003  (JP) ................. 2003-359326

(51) Int. Cl.
*B22F 1/02*  (2006.01)
*B22F 1/00*  (2006.01)
(Continued)

(52) U.S. Cl.
CPC ................. *B22F 1/02* (2013.01); *B22F 1/0003* (2013.01); *B22F 1/0018* (2013.01);
(Continued)

(58) Field of Classification Search
CPC .......... B22F 1/02; B22F 1/0018; B82Y 30/00
USPC ........................................... 428/570
See application file for complete search history.

(56) References Cited

U.S. PATENT DOCUMENTS

2003/0116057 A1    6/2003  Suzuki et al.

FOREIGN PATENT DOCUMENTS

EP    0 960 675 A1    12/1999
EP    1 339 073 A1    8/2003
(Continued)

OTHER PUBLICATIONS

Ashavani Kumar, et al., Investigation into the Interaction between Surface-Bound Alkylamines and Gold Nanoparticles, Langmuir, vol. 19, No. 15, 2003, pp. 6277-6282.
(Continued)

*Primary Examiner* — Weiping Zhu
(74) *Attorney, Agent, or Firm* — Knobbe Martens Olson & Bear LLP

(57) ABSTRACT

The present invention provides a process for simply and easily producing fine metal particles or fine metal oxide particles in the form of a dry powder which can be used as extremely fine particles in a good dispersion state without causing coagulation for a long time even if not stored in a dispersion solvent. Fine metal particles or fine metal oxide particles in the form of a dry powder are prepared using a dispersion in which fine metal particles or fine oxide metal particles having a surface oxidation film are dispersed in an organic solvent in a stable state, while once covering the particle surface with covering agent molecules containing, at a terminal, a functional group having an oxygen atom, a nitrogen atom, or a sulfur atom as a group capable of forming a coordinative bond with metal, and by removing the dispersion solvent, washing and removing excess covering agent molecules with a polar solvent without damaging the covering agent molecule layer covering the fine particle surface, finally evaporating the polar solvent used for washing and drying.

5 Claims, 1 Drawing Sheet

(51) Int. Cl.
*B82Y 30/00* (2011.01)
*C04B 35/626* (2006.01)
*C04B 35/628* (2006.01)
*C04B 35/632* (2006.01)
*C09C 1/62* (2006.01)
*H05K 3/12* (2006.01)

(52) U.S. Cl.
CPC ............. *B22F 1/0062* (2013.01); *B82Y 30/00* (2013.01); *C04B 35/628* (2013.01); *C04B 35/6264* (2013.01); *C04B 35/62805* (2013.01); *C04B 35/62884* (2013.01); *C04B 35/632* (2013.01); *C09C 1/62* (2013.01); *C09C 1/627* (2013.01); *H05K 3/1283* (2013.01); *B22F 2998/00* (2013.01); *C01P 2004/64* (2013.01); *C01P 2006/10* (2013.01); *C04B 2235/40* (2013.01); *C04B 2235/407* (2013.01); *C04B 2235/5454* (2013.01); *H05K 3/1266* (2013.01); *H05K 2203/1131* (2013.01); *H05K 2203/1157* (2013.01); *H05K 2203/122* (2013.01)

(56) References Cited

FOREIGN PATENT DOCUMENTS

| | | |
|---|---|---|
| JP | 3-34211 | 2/1991 |
| JP | 3-140479 | 6/1991 |
| JP | 11-319538 | 11/1999 |
| JP | 2002-299833 A | 10/2002 |
| JP | 2002-309303 A | 10/2002 |
| JP | 2002-334618 | 11/2002 |
| JP | 2003-13106 A | 1/2003 |

OTHER PUBLICATIONS

Supplementary European Search Report issued by the European Patent Office on Oct. 8, 2010 for the counterpart European Patent Application No. 04792641.5.

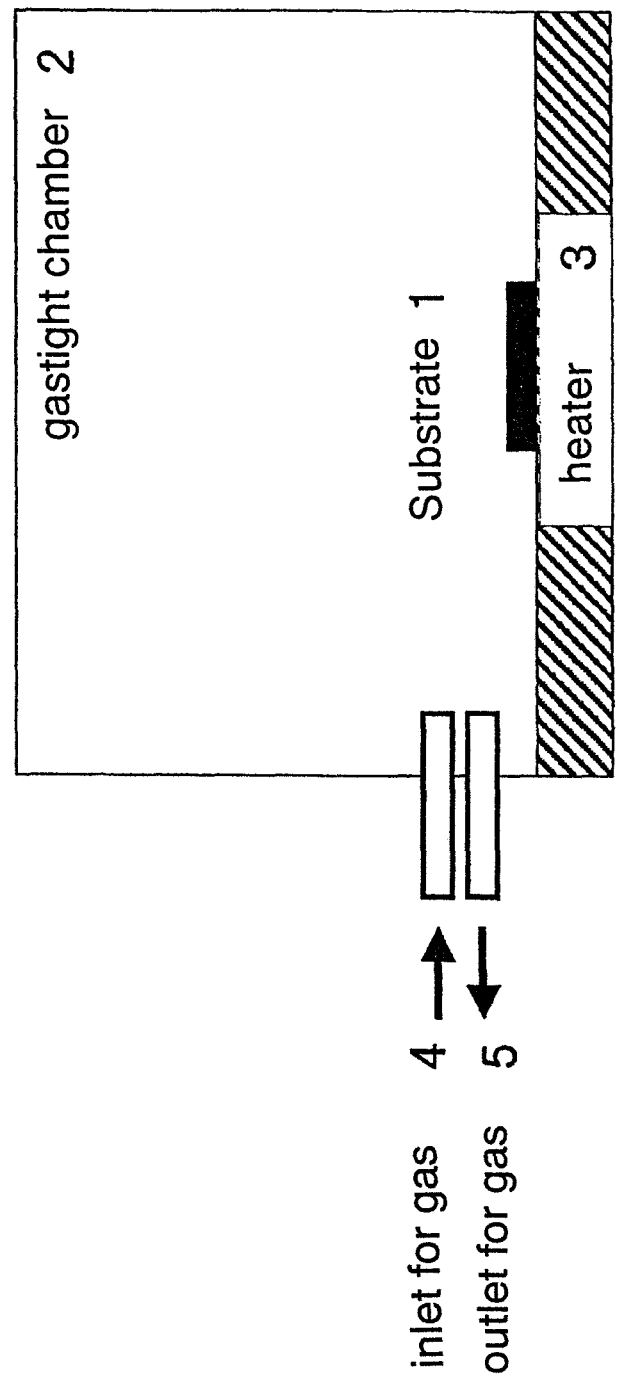

FINE METAL PARTICLES AND FINE METAL OXIDE PARTICLES IN DRY POWDER FORM, AND USE THEREOF

CROSS-REFERENCE TO RELATED APPLICATIONS

This application is a divisional of U.S. application Ser. No. 10/595,440, filed on Apr. 19, 2006 as the U.S. National Phase under 35 U.S.C. §371 of International Application PCT/JP2004/15475, filed Oct. 20, 2004, which claims priority to Japanese Patent Application No. 2003-359326, filed Oct. 20, 2003, which are hereby incorporated by reference in their entirety.

TECHNICAL FIELD

The present invention relates to fine metal particles and fine metal oxide particles in the form of a dry powder, a process for preparing the same and a process for forming a low temperature sintering conductor layer using a dry printing coating layer containing the powdery fine metal particles or the powdery fine metal oxide particles by sintering, at a low temperature, powdery fine metal particles obtained by dry reduction of the powdery fine metal oxide particles or the powdery fine metal particles as they are. More specifically, the present invention relates to a process for forming a low temperature sintering conductor layer by forming a dry printing coating layer having a desired pattern and containing powdery fine metal particles or powdery fine metal oxide particles by using dry printing, in particular, electrophotographic printing, using powdery fine metal particles obtained by dry reduction of the powdery fine metal oxide particles or the powdery fine metal particles as they are. The present invention also relates to, as a use invention of the fine metal particles and the fine metal oxide particles in the form of a dry powder, a fine metal particle dispersion containing the aforementioned powdery fine metal particles dispersed in a dispersion solvent, a fine metal oxide particle dispersion containing the aforementioned powdery fine metal oxide particles dispersed in a dispersion solvent, and a process for forming a low temperature sintering conductor layer by sintering, at a low temperature, fine metal particles obtained by reducing the powdery fine metal oxide particles or the powdery fine metal particles as they are, using a coating layer of the fine metal particle dispersion or the fine metal oxide particle dispersion.

BACKGROUND ART

As one of the processes of producing fine metal particles having an extremely small particle size, e.g., fine metal particles having an average particle size of 100 nm or less, Japanese Patent Application Laid-Open No. 3-34211 discloses a dispersion in which fine metal particles of 10 nm or less prepared by a gas evaporation method are dispersed in a dispersion solvent in a colloidal state and a process for producing the same. Japanese Patent Application Laid-Open No. 11-319538 and other references disclose a dispersion in which fine metal particles having an average particle size of several nm to several 10 nm prepared by a wet process making use of a reduction/deposition method using an amine compound for the reduction are dispersed in a colloidal state and a process for producing the same. The surface of the fine metal particles (metal nanoparticles) having an average particle size of several nm to several 10 nm prepared by a wet process disclosed in Japanese Patent Application Laid-Open No. 11-319538 and other references is covered with a polymer resin and the like to maintain the colloidal state.

It is generally known that fine metal particles having an average particle size of several nm to several 10 nm are sintered at a temperature well below the melting point (for example, even at 200° C. or lower in the case of silver fine particles (nanoparticles) having a clean surface). This is because, when the particle size of fine metal particles (nanoparticles) is sufficiently small, the proportion of atoms in a high energy state present on the particle surface increases in the whole particle, and the surface diffusion of metal atoms increases to a level that cannot be ignored, and as a result, the boundary of grains grows due to this surface diffusion to cause sintering.

When the surfaces of fine metal particles having an average particle size of several nm to several 10 nm are directly contacted, the fine metal particles are fused with each other and form an aggregate, which deteriorates uniform dispersibility in a dispersion solvent. For this reason, the surface of fine metal particles is uniformly covered with alkylamine or the like so that the particles have a surface covering molecular layer, and thus the fine metal particles exhibit high dispersibility.

On the other hand, in recent electronics-related fields, miniaturization of wiring patterns on wiring boards to be used is underway. In addition, regarding metal thin film layers used for forming various electrode patterns, utilization of metal thin film layers having an extremely thin film thickness has been developed. For example, upon forming a fine wiring or a thin film by screen printing, a dispersion of fine metal particles having an extremely small particle size is applied for drawing of ultrafine patterns or formation of thin film coating layers having an extremely thin film thickness. At present, fine particle dispersions of gold and silver applicable to the above purposes are already on the market.

More specifically, regarding processes for forming an ultrafine wiring pattern using a fine metal particle dispersion, methodology has already been established, for example, for using gold fine particles or silver fine particles. For instance, by drawing an extremely fine circuit pattern using a dispersion for ultrafine printing containing gold fine particles or silver fine particles and by subsequent sintering of the fine metal particles, wiring having a line width and a line space of 5 to 50 µm and a volume specific resistivity of $1 \times 10^{-5}$ Ω·cm or lower can be formed on the obtained sintered product wiring layer.

Further, as the line width and the line space are reduced, disconnection due to electromigration has become another problem. In particular, in the part with a small wiring film thickness and a narrow line width formed at a step having differences, the wiring film thickness at the step edge tends to be thinner than that in other parts, and thus the current density is locally increased and frequency of occurrence of disconnection due to electromigration is increased. To avoid disconnection caused by this electromigration phenomenon, use of copper wiring is effective. For example, with much higher integration, utilization of copper materials for wiring patterns on semiconductor devices is being extensively studied.

DISCLOSURE OF THE INVENTION

Conventionally, for formation of a fine pattern wiring layer or formation of a conductor thin film layer having an extremely thin film thickness using a conductor layer obtained by baking fine metal particles, a technique for drawing an intended fine pattern or thin film shaped coating film layer using a dispersion or a paste of fine metal particles uniformly dispersed in a dispersion solvent has been used. The coating film layer drawn using the dispersion or the paste of fine metal particles is dried in order to evaporate the dispersion solvent, and after allowing the fine metal particles to be closely contacted with each other due to the evaporation of the solvent, a heating process is performed to bake the fine metal particles, whereby an extremely closely packed sintered product conductor layer is prepared.

Further, a technique is proposed in which an intended fine pattern or thin film shaped coating film layer is drawn using a dispersion or a paste of fine metal oxide particles in which fine metal oxide particles having an oxide film layer on the surface of fine metal particles are uniformly dispersed in a dispersion solvent instead of fine metal particles; the fine metal oxide particles contained in the drawn coating film layer are allowed to react with a reducing agent to perform a reduction process so that they are reduced to fine metal particles; and after allowing the fine metal particles to be closely contacted with each other, a heating process is performed to bake the fine metal particles, whereby an extremely closely packed sintered product conductor layer is prepared.

Although these wet drawing processes using a dispersion or a paste of fine metal particles or a dispersion or a paste of fine metal oxide particle are effective, application of the dispersion or the paste to other drawing processes are desired in order to more extensively utilize a conductor layer obtained by baking fine metal particles or a conductor layer obtained by performing a reduction process by allowing fine metal oxide particles to react with a reducing agent to once reduce them to fine metal particles and baking the fine metal particles. More specifically, in order to repeatedly form many identical drawing patterns, application to an electrophotographic drawing method which is a dry printing method with high repeat drawability is desired.

The present invention is intended to solve the aforementioned problems, and an object of the present invention is to provide a process for preparing an extremely closely packed sintered product conductor layer, which comprises forming, on the substrate surface for a printed wiring board, a desired pattern of a coating layer of fine particles in the form of toner particles which contains powdery fine metal particles or powdery fine metal oxide particles utilizing an electrophotographic drawing method which is a dry printing method, and performing a heating process using fine metal particles obtained by reducing fine metal oxide particles in the dry coating layer or fine metal particles contained in the toner fine particles, thereby baking the fine metal particles each other. Another object of the present invention is to provide fine metal particles or fine metal oxide particles in the form of a dry powder suitable for preparing fine particles in the form of toner particles containing the powdery fine metal particles or the fine metal oxide particles when forming a coating layer of fine particles in the form of toner particles which contains the powdery fine metal particles or the powdery fine metal oxide particles using an electrophotographic drawing method which is a dry printing method, and a process for preparing the same.

Up to present, a great number of dispersions containing nanoscale fine metal particles have been developed, and there are several techniques for maintaining a good dispersion state in a dispersion solvent for a long time. However, although it is attempted to recover and separate fine metal particles in the form of a dry powder from such dispersions by removing and evaporating the dispersion solvent, the dispersant used for maintaining and improving dispersibility in the dispersion is left behind unnecessarily and easily coagulated to form a bulk. In other cases, although fine metal particles are once recovered in the form of a dry powder, the metal surfaces of adjacent nanoscale fine metal particles are directly contacted and easily fused, and thus stability in long term storage remains to be improved.

On the other hand, fine particles composed only of metal oxide do not cause mutual coagulation at about room temperature. Thus, fine metal oxide particles in the form of a dry powder can be relatively easily prepared. For example, a sintered product conductor layer can be prepared by baking at a relatively low temperature when fine metal particles are prepared by reducing a nanoscale fine metal oxide particles (nanoparticles) in the form of a dry powder, but in order to reduce fine metal oxide particles to fine metal particles by heating, for example, in hydrogen atmosphere, heating at about 800° C. was necessary.

The present inventors have studied the above problems from various viewpoints and developed their improvements. As a means for uniformly dispersing fine metal particles having an average particle size of 1 to 100 nm prepared by a gas evaporation method in a dispersion solvent, a compound having a group containing a nitrogen atom, an oxygen atom or a sulfur atom and capable of forming a coordinative bond via a lone pair of those atoms as a group capable of forming a coordinative bond with a metal element is used as a covering layer. In this regard, it has been found that the covering layer can be kept stable even without a dispersion solvent and can effectively prevent fusion of adjacent nanoscale fine metal particles caused by direct contact of the metal surfaces; and on the other hand, in the case of a dispersion containing a large amount of excess covering agent, the excess covering agent prevents separation of individual fine particles upon evaporation of the dispersion solvent, causing formation of a bulk due to coagulation. As a result of further studies, it has been found that when the compound having a group containing a nitrogen atom, an oxygen atom or a sulfur atom and capable of forming a coordinative bond via a lone pair of those atoms as a group capable of forming a coordinative bond with a metal element does not form a coordinative bond on the metal surface, only the redundant covering agent can be selectively removed by dissolving in a polar solvent as the case of alkylamine. The present inventors have confirmed that when only the redundant covering agent is selectively removed by washing using a polar solvent, then fine metal particles having an appropriate amount of a covering agent layer are filtrated and the remaining polar solvent is evaporated, fine metal particles having an appropriate amount of a covering agent layer can be recovered in the form of a dry powder.

It has also been found that in a dispersion, the fine metal particles having a covering agent layer may have an oxide film on the metal surface, while the covering agent layer can remain fixed to the obtained fine metal particles having a metal oxide film on the surface, and moreover, sharp increase in the film thickness of the metal oxide film can be prevented. In short, it has been found that a metal oxide film having a relatively thin film thickness is formed on the surface of the fine metal particles, and thus fine metal oxide particles having the aforementioned covering agent layer fixed to the surface are prepared. The present inventors have confirmed that, in the case of the above fine metal oxide particles having the covering agent layer as well, fine metal oxide particles having an appropriate amount of a covering agent layer can be recovered in the form of a dry powder by selectively removing only the redundant covering agent by washing using a polar solvent, then filtrating fine metal oxide particles having an appropriate amount of a covering agent layer and evaporating the remaining polar solvent.

It has also been confirmed that when dry powder of the obtained fine metal particles having an appropriate amount of a covering agent layer is heated at a low temperature, preferably in inert gas atmosphere, e.g., reducing atmosphere containing reducing gas or vapor, thereby separating the covering agent layer on the surface and bringing metal surfaces into contact with each other, a sintered product conductor layer can be prepared by baking at a low temperature; and by subjecting the dry powder of fine metal oxide particles having an appropriate amount of a covering agent layer to a reduction process using reducing gas or vapor, the metal oxide film on the surface can be reduced, and the obtained fine metal particles can be formed into a sintered product conductor layer by baking at a low temperature. The present inventors have also found that any of these low temperature heating processes can be performed at a low temperature condition of 350° C. or lower in the case of using fine particles having an average particle size of 1 to 100 nm, and dry powder of fine metal particles having an appropriate amount of a covering agent layer can be formed into a closely packed coated layer on a substrate using, for example, a solid binder resin for toner by a dry printing method, and when the aforementioned low temperature heating process is performed in this state, a sintered product conductor layer of fine metal particles can be formed using a dry printing method. The present invention has been completed based on these sets of findings.

Accordingly, the fine metal particles according to a first embodiment of the present invention are:

fine metal particles in the form of a dry powder, characterized in that an average particle size of the fine metal particles themselves is selected in the range of 1 to 100 nm, the surface of the fine metal particles is covered with one or more compounds having a group containing a nitrogen atom, an oxygen atom or a sulfur atom and capable of forming a coordinative bond via a lone pair of those atoms as a group capable of forming a coordinative bond with a metal element contained in the fine metal particles, a covering amount of said one or more compounds having a group containing a nitrogen atom, an oxygen atom or a sulfur atom is adjusted by selecting the total of said one or more compounds having a group containing a nitrogen atom, an oxygen atom or a sulfur atom in the range of 5 to 35 parts by mass based on 100 parts by mass of the fine metal particles; and the adjustment of the covering amount is carried out by the following treatment comprising steps of:

beforehand bringing said one or more compounds having a group containing a nitrogen atom, an oxygen atom or a sulfur atom into contact with the surface of the fine metal particles having an average particle size selected in the range of 1 to 100 nm, thereby once applying said one or more compounds having a group containing a nitrogen atom, an oxygen atom or a sulfur atom through a coordinative bond with a metal element contained in the fine metal particles in an amount greater than the aimed covering amount in total of said one or more compounds having a group containing a nitrogen atom, an oxygen atom or a sulfur atom based on 100 parts by mass of the fine metal particles to form a covering layer thereof, and preparing, as a starting material, a dispersion in which the fine metal particles having a covering layer of said one or more compounds having a group containing a nitrogen atom, an oxygen atom or a sulfur atom are dispersed in a dispersion solvent comprising one or more organic solvents, removing the organic solvent contained in the dispersion as a dispersion solvent under reduced pressure, thereby concentrating the dispersion, adding, to the dispersion subjected to the treatment for concentration, one or more polar solvents in which said one or more compounds exhibit a higher solubility at room temperature than that in the organic solvent, thereby dissolving excess of one or more compounds having a group containing a nitrogen atom, an oxygen atom or a sulfur atom in said one or more polar solvents, and separating fine metal particles in which the adjustment of the covering amount is attained by removing the excess of one or more compounds having a group containing a nitrogen atom, an oxygen atom or a sulfur atom, as a solid phase component, from the obtained dispersion by filtration, and evaporating the remaining one or more polar solvents to dry up. In particular, fine metal particles in the form of a dry powder composed of a metal species selected from the group consisting of gold, silver, copper, platinum, palladium, tin, nickel, aluminum, zirconium, titanium, iron and tungsten, or fine alloy particles comprising two or more metals selected from the metal species group are preferred for use for the sintered product conductive layer as intended in the present invention.

The fine metal oxide particles according to a first embodiment of the present invention are:

fine metal oxide particles in the form of a dry powder, characterized in that the fine metal oxide particles are fine particles that comprise fine metal particles as a core and a metal oxide film layer on the surface, an average particle size of the particles having a metal oxide film layer on the surface themselves is selected in the range of 1 to 100 nm, the surface of the fine metal oxide particles is covered with one or more compounds having a group containing a nitrogen atom, an oxygen atom or a sulfur atom and capable of forming a coordinative bond via a lone pair of those atoms as a group capable of forming a coordinative bond with a metal element contained in the fine metal oxide particles, a covering amount of said one or more compounds having a group containing a nitrogen atom, an oxygen atom or a sulfur atom is adjusted by selecting the total of said one or more compounds having a group containing a nitrogen atom, an oxygen atom or a sulfur atom in the range of 5 to 35 parts by mass based on 100 parts by mass of the fine metal oxide particles, and the formation of the metal oxide film layer on the surface and the adjustment of the covering amount is carried out by the following treatment comprising steps of:

beforehand bringing said one or more compounds having a group containing a nitrogen atom, an oxygen atom or a sulfur atom into contact with the surface of fine metal particles having an average particle size selected in the range of 1 to 100 nm which correspond to the fine metal oxide particles, thereby once applying said one or more compounds having a group containing a nitrogen atom, an oxygen atom or a sulfur atom through a coordinative bond with a metal element contained in the fine metal particles in an amount greater than the aimed covering amount in total of said one or more compounds having a group containing a nitrogen atom, an oxygen atom or a sulfur atom based on 100 parts by mass of the fine metal particles to form a covering layer thereof, and preparing, as a starting material, a dispersion in which the fine metal particles having a covering layer of said one or more compounds having a group containing a nitrogen atom, an oxygen atom or a sulfur atom are dispersed in a dispersion solvent comprising one or more organic solvents, wherein the dispersion in which the fine metal oxide particles having a covering layer formed thereon, of which a metal oxide film layer on the surface is formed by surface oxidation of the fine metal particles upon preparation of the dispersion or later in the prepared dispersion, are dispersed is employed as a starting material, removing the organic solvent contained in the dispersion as a dispersion solvent under reduced pressure, thereby concentrating the dispersion, adding, to the dispersion subjected to the treatment for concentration, one or more polar solvents in which said one or more compounds exhibit a higher solubility at room temperature than that in the organic solvent, thereby dissolving excess of one or more compounds having a group containing a nitrogen atom, an oxygen atom or a sulfur atom in said one or more polar solvents, and then separating fine metal oxide particles in which the adjustment of the covering amount is attained by removing the excess of one or more compounds having a group containing a nitrogen atom, an oxygen atom or a sulfur atom, as a solid phase component, from the obtained dispersion by filtration, and evaporating the remaining one or more polar solvents to dry up. In particular, fine metal particles themselves which correspond to the fine metal oxide particles composed of a metal species selected from the group consisting of gold, silver, copper, platinum, palladium, tin, nickel, aluminum, zirconium, titanium, iron and tungsten, or fine alloy particles composed of two or more metals selected from the metal species group are preferred for use for the sintered product conductive layer as intended in the present invention.

The present invention also provides, as a use invention of the fine metal particles in the form of a dry powder according to the first embodiment of the present invention, a process for forming a sintered product layer of fine metal particles by forming a coated layer of fine metal particles in the form of a dry powder on a substrate by a dry printing method using the above-described fine metal particles in the form of a dry powder according to the first embodiment of the present invention.

Accordingly, one of the processes of forming a conductive wiring pattern according to the first embodiment of the present invention is:

a process for forming a conductive wiring pattern comprising a sintered product layer of fine metal particles on a substrate, characterized in that the sintered product layer is a layer that is obtained by bringing fine metal particles having an average particle size selected in the range of 1 to 100 nm into contact with each other and sintering the particles by heating at a temperature no higher than 350° C., the process comprises the steps of:

forming a fine metal particle coating layer having the wiring pattern by dry applying the fine metal particles in the form of a dry powder according to the first embodiment of the present invention to the substrate using a solid binder resin, and softening the solid binder resin contained in the fine metal particle coating layer in said treatment for heating up and simultaneously, performing the treatment for sintering the fine metal particles contained in the fine metal particle coating layer, wherein, upon heating up in the baking treatment, the compound having a group containing a nitrogen atom, an oxygen atom or a sulfur atom covering the surface of the fine metal particle is separated from the surface of the fine metal particle and dissolved in the softened binder resin, whereby surface contact of the fine metal particles is attained to sinter the fine metal particles with each other.

In particular, in this process for forming a conductive wiring pattern using the fine metal particles in the form of a dry powder according to the first embodiment of the present invention, it is preferred that the step of forming a fine metal particle coating layer having the wiring pattern by dry applying the fine metal particles in the form of a dry powder to the substrate using a solid binder resin is carried out by the method of applying toner particles that are prepared by using the above-described fine metal particles in the form of a dry powder according to the present invention as core particles and said solid binder resin as a resin layer for toner by means of an electrophotographic image printing method to form a toner layer having the wiring pattern on the substrate.

Likewise, the present invention also provides, as a use invention of the fine metal oxide particles in the form of a dry powder according to the first embodiment of the present invention, a process for forming a sintered product layer of fine metal particles by forming a coated layer of fine metal oxide particles in the form of a dry powder on a substrate by a dry printing method using the above-described fine metal oxide particles in the form of a dry powder and reducing the fine metal oxide particles.

Accordingly, another process for forming a conductive wiring pattern according to the first embodiment of the present invention is:

a process for forming a conductive wiring pattern comprising a sintered product layer of fine metal particles on a substrate, characterized in that the sintered product layer is a layer that is obtained by bringing fine metal particles having an average particle size selected in the range of 1 to 100 nm into contact with each other under a reducing atmosphere and sintering the particles by heating at a temperature no higher than 350° C., and the process comprises the steps of:

forming a fine metal oxide particle coating layer having the wiring pattern by dry applying the fine metal oxide particles in the form of a dry powder according to the first embodiment of the present invention having the above-described construction to the substrate using a solid binder resin, allowing fine metal oxide particles contained in the fine metal oxide particle coating layer to react with gas or vapor of a compound having reducing ability at the heating temperature under a reducing atmosphere, thereby reducing the fine metal oxide particles from their surface to the corresponding fine metal particles, and softening the solid binder resin contained in the fine metal oxide particle coating layer in said treatment for heating up and simultaneously, performing the treatment for sintering the fine metal particles reduced in the reduction process, wherein, upon heating up in the baking treatment, the compound having a group containing a nitrogen atom, an oxygen atom or a sulfur atom covering the fine metal oxide particle surface is separated from the fine metal oxide particle surface and dissolved in the softened binder resin, whereby surface contact of the fine metal particles is attained to sinter the fine metal particles with each other.

In particular, in this process for forming a conductive wiring pattern using the fine metal oxide particles in the form of a dry powder according to the first embodiment of the present invention, it is preferred that the step of forming a fine metal oxide particle coating layer having the wiring pattern by dry applying the fine metal oxide particles in the form of a dry powder to the substrate using a solid binder resin is carried out by a method of applying toner particles that are prepared by using the fine metal oxide particles in the form of a dry powder according to the first embodiment of the present invention having the above-described construction as core particles and said solid binder resin as a resin layer for toner by means of an electrophotographic image printing method to form a toner layer having the wiring pattern on the substrate.

In this case, the compound having reducing ability used as a reducing agent in the reduction process of the fine metal oxide particles is preferably an organic compound containing a hydroxyl group on a carbon atom (C—OH) which can be converted to an oxo group (═O) or a formyl group (—CHO) by oxidation, or a mixture of two or more thereof. The compound having reducing ability used as a reducing agent in the reduction process of the fine metal oxide particles is preferably an organic compound containing an alcoholic hydroxyl group or a mixture of two or more thereof. In particular, the compound having reducing ability used as a reducing agent in the reduction process of the fine metal oxide particles is more preferably an organic compound containing two or more hydroxyl groups or a mixture of two or more thereof. In this embodiment, the compound having reducing ability used as a reducing agent in the reduction process of the fine metal oxide particles is more preferably selected from glycerol (1,2,3-propanetriol), ethylene glycol (1,2-ethanediol), propylene glycol (1,2-propanediol) and 1,3-propanediol.

The process for preparing the fine metal particles according to the first embodiment of the present invention is:

a process for preparing fine metal particles in the form of a dry powder, characterized in that an average particle size of the fine metal particles themselves is selected in the range of 1 to 100 nm, the surface of the fine metal particles is covered with one or more compounds having a group containing a nitrogen atom, an oxygen atom or a sulfur atom and capable of forming a coordinative bond via a lone pair of those atoms as a group capable of forming a coordinative bond with a metal element contained in the fine metal particles;

a covering amount of said one or more compounds having a group containing a nitrogen atom, an oxygen atom or a sulfur atom is adjusted to selecting the total of said one or more compounds having a group containing a nitrogen atom, an oxygen atom or a sulfur atom in the range of 5 to 35 parts by mass based on 100 parts by mass of the fine metal particles; and as for the step of adjustment of the covering amount, the process comprises the steps of:

beforehand bringing said one or more compounds having a group containing a nitrogen atom, an oxygen atom or a sulfur atom into contact with the surface of the fine metal particles having an average particle size selected in the range of 1 to 100 nm, thereby once applying said one or more compounds having a group containing a nitrogen atom, an oxygen atom or a sulfur atom through a coordinative bond with a metal element contained in the fine metal particles in an amount greater than the aimed covering amount in total of said one or more compounds having a group containing a nitrogen atom, an oxygen atom or a sulfur atom based on 100 parts by mass of the fine metal particles to form a covering layer thereof, and preparing, as a starting material, a dispersion in which the fine metal particles having a covering layer of said one or more compounds having a group containing a nitrogen atom, an oxygen atom or a sulfur atom are dispersed in a dispersion solvent comprising one or more organic solvents, removing the organic solvent contained in the dispersion as a dispersion solvent under reduced pressure, thereby concentrating the dispersion, adding, to the dispersion subjected to the treatment for concentration, one or more polar solvents in which said one or more compounds exhibit a higher solubility at room temperature than that in the organic solvent, thereby dissolving excess of one or more compounds having a group containing a nitrogen atom, an oxygen atom or a sulfur atom in said one or more polar solvents, and then separating fine metal particles in which the adjustment of the covering amount is attained by removing the excess of one or more compounds having a group containing a nitrogen atom, an oxygen atom or a sulfur atom, as a solid phase component, from the obtained dispersion by filtration, and performing the treatment for evaporating the remaining one or more polar solvents to dry up. This process is useful when the fine metal particles themselves are fine metal particles of a metal species selected from the group consisting of gold, silver, copper, platinum, palladium, tin, nickel, aluminum, zirconium, titanium, iron and tungsten, or fine alloy particles composed of two or more metals selected from the metal species group.

The process for preparing the fine metal oxide particles according to the first embodiment of the present invention is:

a process for preparing fine metal oxide particles in the form of a dry powder, characterized in that the fine metal oxide particles are fine particles that comprise fine metal particles as a core and a metal oxide film layer on the surface, an average particle size of the particles having a metal oxide film layer on the surface themselves is selected in the range of 1 to 100 nm, the surface of the fine metal oxide particles is covered with one or more compounds having a group containing a nitrogen atom, an oxygen atom or a sulfur atom and capable of forming a coordinative bond via a lone pair of those atoms as a group capable of forming a coordinative bond with a metal element contained in the fine metal oxide particles, and a covering amount of said one or more compounds having a group containing a nitrogen atom, an oxygen atom or a sulfur atom is adjusted by selecting the total of said one or more compounds having a group containing a nitrogen atom, an oxygen atom or a sulfur atom in the range of 5 to 35 parts by mass based on 100 parts by mass of the fine metal oxide particles, and as for the step of formation of the metal oxide film layer on the surface and adjustment of the covering amount, the process comprises the steps of:

beforehand bringing said one or more compounds having a group containing a nitrogen atom, an oxygen atom or a sulfur atom into contact with the surface of the fine metal particles having an average particle size selected in the range of 1 to 100 nm which correspond to the fine metal oxide particles, thereby once applying said one or more compounds having a group containing a nitrogen atom, an oxygen atom or a sulfur atom through a coordinative bond with a metal element contained in the fine metal particles in an amount greater than the aimed covering amount in total of said one or more compounds having a group containing a nitrogen atom, an oxygen atom or a sulfur atom based on 100 parts by mass of the fine metal particles to form a covering layer thereof, and preparing, as a starting material, a dispersion in which the fine metal particles having a covering layer of said one or more compounds having a group containing a nitrogen atom, an oxygen atom or a sulfur atom are dispersed in a dispersion solvent comprising one or more organic solvents, wherein the dispersion in which the fine metal oxide particles having a covering layer, on which a metal oxide film layer is formed on the surface by surface oxidation of the fine metal particles upon preparation of the dispersion or later in the prepared dispersion are dispersed is prepared as a starting material, removing the organic solvent contained in the dispersion as a dispersion solvent under reduced pressure, thereby concentrating the dispersion, adding, to the dispersion subjected to the treatment for concentration, one or more polar solvents in which said one or more compounds exhibit a higher solubility at room temperature than that in the organic solvent, thereby dissolving excess of one or more compounds having a group containing a nitrogen atom, an oxygen atom or a sulfur atom in said one or more polar solvents, and then separating fine metal oxide particles in which the adjustment of the covering amount is attained by removing the excess of one or more compounds having a group containing a nitrogen atom, an oxygen atom or a sulfur atom, as a solid phase component, from the obtained dispersion by filtration, and performing the treatment of evaporating the remaining one or more polar solvents to dry up. This process can be preferably used when, for example, the fine metal particles themselves which correspond to the fine metal oxide particles are fine metal particles of a metal species selected from the group consisting of gold, silver, copper, platinum, palladium, tin, nickel, aluminum, zirconium, titanium, iron and tungsten, or fine alloy particles composed of two or more metals selected from the metal species group.

In addition, another embodiment of the process for forming a conductive wiring pattern according to the first embodiment of the present invention is:

a process for forming a conductive wiring pattern comprising a sintered product layer of fine metal particles on a substrate, characterized in that the sintered product layer is a layer that is obtained by bringing fine metal particles having an average particle size selected in the range of 1 to 100 nm into contact with each other and sintering the particles by heating at a temperature no higher than 350° C., and the process comprises the steps of:

forming a fine metal particle coating layer having the wiring pattern by dry applying the fine metal particles in the form of a dry powder according to the first embodiment of the present invention having the above-described construction to the substrate, and melting said one or more compounds having a group containing a nitrogen atom, an oxygen atom or a sulfur atom contained in the fine metal particle coating layer and constituting the covering layer on the surface of the fine metal particle in said treatment for heating up and simultaneously, performing the treatment for sintering the fine metal particles contained in the fine metal particle coating layer, wherein, upon heating up in the baking treatment, the compound having a group containing a nitrogen atom, an oxygen atom or a sulfur atom covering the surface of the fine metal particle is separated from the surface of the fine metal particle and melted with fusing with each other, whereby surface contact of the fine metal particles is attained to sinter the fine metal particles with each other.

Alternatively, still another embodiment of the process for forming a conductive wiring pattern according to the first embodiment of the present invention is:

a process for forming a conductive wiring pattern comprising a sintered product layer of fine metal particles on a substrate, characterized in that the sintered product layer is a layer that is obtained by bringing fine metal particles having an average particle size selected in the range of 1 to 100 nm into contact with each other under a reducing atmosphere and sintering the particles by heating at a temperature no higher than 350° C., and the process comprises the steps of:

forming a fine metal oxide particle coating layer having the wiring pattern by dry applying fine metal oxide particles in the form of a dry powder according to the first embodiment of the present invention having the above-described construction to the substrate, allowing fine metal oxide particles contained in the fine metal oxide particle coating layer to react with gas or vapor of a compound having reducing ability at the heating temperature under a reducing atmosphere, thereby reducing the fine metal oxide particles from their surface to the corresponding fine metal particles, and melting said one or more compounds having a group containing a nitrogen atom, an oxygen atom or a sulfur atom contained in the fine metal oxide particle coating layer and constituting the covering layer on the fine metal oxide particle surface in said treatment for heating up and simultaneously, performing the treatment for sintering the fine metal particles reduced in the reduction process, wherein, upon heating up in the baking treatment, the compound having a group containing a nitrogen atom, an oxygen atom or a sulfur atom covering the fine metal oxide particle surface is separated from the fine metal oxide particle surface and melted with fusing with each other, whereby surface contact of the fine metal particles is attained to sinter the fine metal particles with each other.

On the other hand, another embodiment (second embodiment) of fine metal particles according to the present invention is:

fine metal particles in the form of a dry powder characterized in that an average particle size of the fine metal particles themselves is selected in the range of 1 to 100 nm, the surface of the fine metal particles is covered with one or more carboxylic acids capable of forming a metal salt with metal contained in the fine metal particles, a covering amount of said one or more carboxylic acids is adjusted by selecting the total of said one or more carboxylic acids in the range of 5 to 35 parts by mass based on 100 parts by mass of the fine metal particles; and the adjustment of the covering amount is carried out by the following treatment comprising steps of:

beforehand bringing said one or more carboxylic acids capable of forming a metal salt with metal contained in the surface of the fine metal particle into contact with the fine metal particles having an average particle size selected in the range of 1 to 100 nm, thereby once applying said one or more carboxylic acids in the form of carboxylic acid fixed to a metal atom on the surface contained in the fine metal particles by a Coulombic interaction or in the form of a carboxylate composed of a metal cation species and a carboxylic acid anion species in an amount greater than the aimed covering amount in total of said one or more carboxylic acids constituting the covering layer based on 100 parts by mass of the fine metal particles to form a covering layer thereof, and preparing, as a starting material, a dispersion containing the fine metal particles having a carboxylic acid covering layer dispersed in a dispersion solvent comprising one or more organic solvents, removing the organic solvent contained in the dispersion as a dispersion solvent under reduced pressure, thereby concentrating the dispersion, adding, to the dispersion subjected to the treatment for concentration, one or more polar solvents in which said one or more carboxylic acids constituting the covering layer exhibit a higher solubility at room temperature than that in the organic solvent, thereby dissolving excess of one or more carboxylic acids in said one or more polar solvents, and then separating fine metal particles in which the adjustment of the covering amount is attained by removing the excess of one or more carboxylic acids, as a solid phase component, from the obtained dispersion by filtration, and evaporating the remaining one or more polar solvents to dry up.

Another embodiment (second embodiment) of the fine metal oxide particles according to the present invention is:

fine metal oxide particles in the form of a dry powder, characterized in that the fine metal oxide particles are fine particles that comprise fine metal particles as a core and a metal oxide film layer on the surface, an average particle size of the particles having a metal oxide film layer on the surface themselves is selected in the range of 1 to 100 nm, the surface of the fine metal oxide particles is covered with one or more carboxylic acids capable of forming a metal salt with metal contained in the fine metal oxide particles, a covering amount of said one or more carboxylic acids is adjusted by selecting the total of said one or more carboxylic acids in the range of 5 to 35 parts by mass based on 100 parts by mass of the fine metal oxide particles, and the formation of the metal oxide film layer on the surface and the adjustment of the covering amount is carried out by the following treatment comprising steps of:

beforehand bringing said one or more carboxylic acids into contact with the surface of the fine metal particles having an average particle size selected in the range of 1 to 100 nm which correspond to the fine metal oxide particles, thereby once applying said one or more carboxylic acids in the form of carboxylic acid fixed to a metal atom on the surface contained in the fine metal particles by a Coulombic interaction or in the form of a carboxylate composed of a metal cation species and a carboxylic acid anion species in an amount greater than the aimed covering amount in total of said one or more carboxylic acids constituting the covering layer based on 100 parts by mass of the fine metal particles to form a covering layer thereof, and preparing, as a starting material, a dispersion containing the fine metal particles having a carboxylic acid covering layer dispersed in a dispersion solvent comprising one or more organic solvents, wherein the dispersion containing the fine metal oxide particles having a covering layer, on which a metal oxide film layer is formed on the surface by surface oxidation of the fine metal particles upon preparation of the starting material or later in the prepared dispersion is prepared as a starting material, removing the organic solvent contained in the dispersion as a dispersion solvent under reduced pressure, thereby concentrating the dispersion, adding, to the dispersion subjected to the treatment for concentration, one or more polar solvents in which said one or more carboxylic acids constituting the covering layer exhibit a higher solubility at room temperature than that in the organic solvent, thereby dissolving excess of one or more carboxylic acids in said one or more polar solvents, and then separating fine metal oxide particles in which the adjustment of covering amount is attained by removing the excess of one or more carboxylic acids, as a solid phase component, from the obtained dispersion by filtration, and evaporating the remaining one or more polar solvents to dry up.

Further, the present invention also provides, as a use invention of the fine metal particles in the form of a dry powder according to the first embodiment of the present invention, an invention of a fine metal particle dispersion in which fine metal particles in the form of a dry powder are uniformly re-dispersed in a high boiling point solvent using the above-described fine metal particles in the form of a dry powder according to the first embodiment of the present invention as a starting material.

Accordingly, one of the fine metal particle dispersions according to the first embodiment of the present invention is:

a fine metal particle dispersion comprising fine metal particles uniformly dispersed in a dispersion solvent, characterized in that the fine metal particles are uniformly dispersed in the dispersion solvent by re-dispersing the fine metal particles in the form of a dry powder according to claim 1 or 2 in the dispersion solvent, the dispersion solvent constituting the fine metal particle dispersion after re-dispersion is a high boiling point solvent having a boiling point of 100° C. or higher but 300° C. or lower, and the fine metal particle dispersion has a viscosity adjusted to 50 to 200 Pa·s (25° C.) by selecting the content of the dispersion solvent in the fine metal particle dispersion in the range of 3 to 25 parts by mass based on 100 parts by mass of the fine metal particles. In this case, it is preferred that the content of the dispersion solvent in the fine metal particle dispersion is selected in the range of 5 to 20 parts by mass based on 100 parts by mass of the fine metal particles.

Further, another one of the fine metal particle dispersions according to the first embodiment of the present invention is:

a fine metal particle dispersion comprising fine metal particles uniformly dispersed in a dispersion solvent, characterized in that the fine metal particles are uniformly dispersed in the dispersion solvent by re-dispersing the fine metal particles in the form of a dry powder according to the first embodiment of the present invention having the above-described construction in the dispersion solvent, the dispersion solvent constituting the fine metal particle dispersion after re-dispersion is a high boiling point solvent having a boiling point of 100° C. or higher but 300° C. or lower, and a viscosity of the fine metal particle dispersion is adjusted in the range of 5 to 30 mPa·s (25° C.) by selecting the content of the dispersion solvent in the fine metal particle dispersion in the range of 30 to 80 parts by mass based on 100 parts by mass of the fine metal particles. In this case, it is more preferred that the content of the dispersion solvent in the fine metal particle dispersion is selected in the range of 40 to 80 parts by mass based on 100 parts by mass of the fine metal particles.

Likewise, the present invention also provides, as a use invention of the fine metal oxide particles in the form of a dry powder according to the first embodiment of the present invention, an invention of a fine metal oxide particle dispersion in which fine metal oxide particles in the form of a dry powder are uniformly re-dispersed in a high boiling point solvent using the above-described fine metal oxide particles in the form of a dry powder according to the first embodiment of the present invention as a starting material.

Accordingly, one of the fine metal particle oxide dispersions according to the first embodiment of the present invention is:

a fine metal oxide particle dispersion comprising fine metal oxide particles uniformly dispersed in a dispersion solvent, characterized in that the fine metal oxide particles are uniformly dispersed in the dispersion solvent by re-dispersing the fine metal oxide particles in the form of a dry powder according to the first embodiment of the present invention having the above-described construction in the dispersion solvent, the dispersion solvent constituting the fine metal oxide particle dispersion after re-dispersion is a high boiling point solvent having a boiling point of 100° C. or higher but 300° C. or lower, and the fine metal oxide particle dispersion has a viscosity adjusted to 50 to 200 Pa·s (25° C.) by selecting the content of the dispersion solvent in the fine metal oxide particle dispersion in the range of 3 to 25 parts by mass based on 100 parts by mass of the fine metal oxide particles. In that case, it is preferred that the content of the dispersion solvent in the fine metal oxide particle dispersion is selected in the range of 3 to 15 parts by mass based on 100 parts by mass of the fine metal oxide particles.

Further, another one of the fine metal oxide particle dispersions according to the first embodiment of the present invention is:

a fine metal oxide particle dispersion comprising fine metal oxide particles uniformly dispersed in a dispersion solvent, characterized in that the fine metal oxide particles are uniformly dispersed in the dispersion solvent by re-dispersing the fine metal oxide particles in the form of a dry powder according to the first embodiment of the present invention having the above-described construction in the dispersion solvent, the dispersion solvent constituting the fine metal oxide particle dispersion after re-dispersion is a high boiling point solvent having a boiling point of 100° C. or higher but 300° C. or lower, and a viscosity of the fine metal oxide particle dispersion is adjusted in the range of 5 to 30 mPa·s (25° C.) by selecting the content of the dispersion solvent in the fine metal oxide particle dispersion in the range of 30 to 70 parts by mass based on 100 parts by mass of the fine metal oxide particles. In that case, it is preferred that the content of the dispersion solvent in the fine metal oxide particle dispersion is selected in the range of 40 to 65 parts by mass based on 100 parts by mass of the fine metal oxide particles.

In addition to the invention of the fine metal particle dispersion according to the first embodiment of the present invention described above, the present invention also provides, as a use invention of the fine metal particles in the form of a dry powder according to the first embodiment of the present invention, a process for forming a sintered product layer of fine metal particles, which comprises applying the fine metal particle dispersion prepared using the fine metal particles in the form of a dry powder according to the first embodiment of the present invention as a starting material to a substrate by various printing methods, thereby forming a coating layer of the fine metal particle dispersion and forming a sintered product layer of the fine metal particles contained in the coating layer. Accordingly, the process for forming a conductive wiring pattern using the fine metal particle dispersion according to the first embodiment of the present invention having the above-described construction is:

a process for forming a conductive wiring pattern comprising a sintered product layer of fine metal particles on a substrate, characterized in that the sintered product layer is a layer that is obtained by bringing fine metal particles having an average particle size selected in the range of 1 to 100 nm into contact with each other and sintering the particles by heating at a temperature no higher than 350° C., and the process comprises the steps of:

forming a fine metal particle dispersion coating layer having the wiring pattern by applying, to the substrate, the fine metal particle dispersion using a high boiling point solvent as a dispersion solvent according to the first embodiment of the present invention having the above-described construction and evaporating and removing the high boiling point solvent contained in the fine metal particle dispersion coating layer in said treatment for heating up and simultaneously, performing the treatment for sintering the fine metal particles contained in the fine metal particle dispersion coating layer, wherein, upon heating up in the baking treatment, the compound having a group containing a nitrogen atom, an oxygen atom or a sulfur atom covering the surface of the fine metal particle is separated from the surface of the fine metal particle, whereby surface contact of the fine metal particles is attained to sinter the fine metal particles with each other. In that case, it is more preferred that the fine metal particles contained in the fine metal particle dispersion are fine metal particles of a metal species selected from the group consisting of gold, silver, copper, platinum, palladium and nickel, or fine alloy particles composed of two or more metals selected from the metal species group.

Likewise, in addition to the invention of the fine metal oxide particle dispersion according to the first embodiment of the present invention described above, the present invention also provides, as a use invention of the fine metal oxide particles in the form of a dry powder according to the first embodiment of the present invention, a process for forming a sintered product layer of fine metal particles, which comprises applying, to a substrate, the fine metal oxide particle dispersion prepared using fine metal oxide particles in the form of a dry powder according to the first embodiment of the present invention as a starting material by various printing methods, thereby forming a coating layer of the fine metal oxide particle dispersion and forming a sintered product layer of the corresponding fine metal particles reduced from the fine metal oxide particles contained in the coating layer. Accordingly, the process for forming a conductive wiring pattern using the fine metal oxide particle dispersion according to the first embodiment of the present invention having the above-described construction is:

a process for forming a conductive wiring pattern comprising a sintered product layer of fine metal particles on a substrate, characterized in that the sintered product layer is a layer that is obtained by bringing fine metal particles having an average particle size selected in the range of 1 to 100 nm into contact with each other under a reducing atmosphere and sintering the particles by heating at a temperature no higher than 350° C., and the process comprises the steps of:

forming a fine metal oxide particle dispersion coating layer having the wiring pattern by applying, to the substrate, the fine metal oxide particle dispersion using a high boiling point solvent as a dispersion solvent according to the first embodiment of the present invention having the above-described construction, and allowing the fine metal oxide particles contained in the fine metal oxide particle coating layer to react with gas or vapor of a compound having reducing ability at the heating temperature under a reducing atmosphere, thereby reducing the fine metal oxide particles from their surface to the corresponding fine metal particles, evaporating the high boiling point solvent contained in the fine metal oxide particle dispersion coating layer in said treatment for heating up and simultaneously, performing the treatment for sintering the fine metal particles reduced in the reduction process, wherein, upon heating up in the baking treatment, the compound having a group containing a nitrogen atom, an oxygen atom or a sulfur atom covering the fine metal oxide particle surface is separated from the fine metal oxide particle surface and evaporated with the high boiling point solvent, whereby surface contact of fine metal particles is attained to sinter the fine metal particles with each other. In that case, it is more preferred that the fine metal particles themselves which correspond to the fine metal oxide particles contained in the fine metal particle dispersion are fine metal particles of a metal species selected from the group consisting of silver, copper and nickel, or fine alloy particles composed of two or more metals selected from the metal species group.

The present invention enables simple preparation of fine metal particles or fine metal oxide particles in the form of a dry powder which can be used as extremely fine particles in a good dispersion state without causing coagulation for a long period even if not stored in a dispersion solvent. The prepared fine metal particles or fine metal oxide particles in the form of a dry powder are, for example, formed into toner particles using a solid binder resin for toner, and a coated layer having a desired pattern is formed on a film-shaped substrate material surface using an electrophotographic image printing method, and then by performing a heating process, a sintered product conductor layer in which the contained fine metal particles or fine metal particles obtained by reducing fine metal oxide particles are sintered can be prepared. This process for forming a sintered product conductor layer using a dry printing method is useful for utilizing a sintered product conductor layer in which fine metal particles are sintered in a broader range of fields in addition to conventional methods of forming a sintered product conductor layer using a paste dispersion by a wet printing method.

In addition to the application to dry printing method described above, the fine metal particles or the fine metal oxide particles in the form of a dry powder of the present invention may also be used as a conductive powder coating for forming fine wiring, a conductive adhesive for conducting electronic parts, and by re-dispersing in another solvent, the particles may be used as a conductive medium for a conductive fine particle dispersion for forming fine wiring having a low resistance and high reliability.

BRIEF DESCRIPTION OF THE DRAWINGS

FIG. 1 is a view schematically illustrating a structure of an apparatus for reduction/sintering using a reducing organic compound, which can be used for practicing the reduction/sintering processes in the process for forming a copper sintered product fine wiring pattern according to the present invention.

Symbols in FIG. 1 represent the following meanings:
1 substrate
2 gastight chamber of reduction/sintering apparatus
3 heater for heating in reduction/sintering process
4 inlet for gas
5 outlet for gas

BEST MODE FOR CARRYING OUT THE INVENTION

The present inventors have conducted intensive studies in order to solve these problems and have developed a process for preparing powdery fine metal particles which are re-dispersible and have long term reliability, using a fine metal particle dispersion having a particle size of 1 to 100 nm as a starting material. It has been also confirmed that a fine conductive pattern can be formed by a process for forming wiring using the powdery fine metal particles or the powdery fine metal oxide particles as they are or by an electrophotographic image printing method using toner containing these particles as a main component. Further, by heating and baking, wiring having a low resistance could be formed. It has also been confirmed that in the case of fine metal oxide particles, reduction and sintering proceed simultaneously at a low temperature condition of 350° C. or lower by using a reducing compound such as alcohol as a reducing agent, whereby wiring having a low resistance can be formed, and the present invention has been completed.

Specifically, powdery fine metal particles or powdery fine metal oxide particles are obtained by removing, by washing, excess dispersing agent and solvent from a dispersion in which fine metal particles or metal oxide whose surface is covered with a covering agent containing a functional group having an oxygen atom, a nitrogen atom or a sulfur atom at the terminal are dispersed in a solvent in a stable state without disturbing the stability of the fine particles, and evaporating the solvent used for washing. These particles have a feature that they are present in the form of stable powdery fine metal particles or powdery fine metal oxide particles without coagulation, easily re-dispersible in a solvent and can be formed into a very stable fine metal particle dispersion or fine metal oxide particle dispersion containing no coagulated substance.

In the following, the present invention is described in more detail.

In the process for forming a wiring pattern using the sintered product conductor layer of the present invention, a property is utilized that a closely packed sintered product layer of fine metal particles can be formed even by low temperature heating by bringing metal surfaces of fine metal particles having an average particle size selected in the range of 1 to 100 nm into contact with each other.

As described above, when extremely fine metal particles are used in the form of dry powder and metal surfaces of fine metal particles are brought into contact, fine metal particles are fused with each other and coagulate, and such a coagulated body is unfavorable for preparing a sintered product conductor layer as intended in the present invention. To prevent such coagulation of fine particles, fine metal particles having a covering layer of a low molecular weight substance on the surface dispersed in liquid are used as a starting material.

More specifically, in the first embodiment of the present invention, the surface of the fine metal particles used as a raw material is covered with one or more compounds having a group containing a nitrogen atom, an oxygen atom or a sulfur atom as a group capable of forming a coordinative bond with a metal element contained in the fine metal particles. In other words, a dispersion of fine metal particles dispersed in one or more organic solvents is used, with the metal surface of fine metal particles being uniformly covered with one or more compounds having a group containing a nitrogen atom, an oxygen atom or a sulfur atom as a group capable of forming a coordinative bond with a metal element contained in the fine metal particles, for example, with maintaining the particles being covered with an amine compound having one or more terminal amino groups.

The role of covering layer is to prevent coagulation of fine metal particles contained in conductive paste while maintaining high anti-coagulation properties during storage, as the metal surfaces of fine metal particles are not directly contacted with each other before heating. Also, even if the particles come into contact with water or oxygen molecules in the air upon application, no direct contact with water molecules or oxygen molecules occur because the surface of the fine metal particles is covered with the covering layer. Thus, the covering layer also has a function of preventing formation of natural oxide on the surface of the fine metal particle due to water or oxygen molecules in the air.

In the first embodiment of the present invention, the compound used for uniformly covering the surface of fine metal particles utilizes a group having a lone pair in a nitrogen atom, an oxygen atom or a sulfur atom when forming a coordinative bond with a metal element. Examples of groups containing a nitrogen atom include an amino group. Examples of groups containing a sulfur atom include a sulfanyl group (—SH) and a sulfide-type sulfanediyl group (—S—). Examples of groups having an oxygen atom include a hydroxyl group (—OH) and an ether-type oxy group (—O—).

Typical examples of useful compounds containing an amino group include alkylamine. Preferred is alkylamine which forms a coordinative bond with a metal element and is not separated in a normal storing condition, specifically, of lower than 40° C., and has a boiling point of 60° C. or higher, preferably 100° C. or higher, more preferably 150° C. or higher. At the same time, it is desired that upon low temperature heating and sintering treatment of fine metal particles, alkylamine is separated from the surface of the fine metal particle and can finally be evaporated. Thus, alkylamine having a boiling point of lower than 300° C., usually 250° C. or lower is preferred. Useful is alkylamine containing an alkyl group whose number of carbon atoms is selected from C8 to C18 and having an amino group at an alkyl chain terminal. For example, C8 to C18 alkylamines described above are preferably used in view of their handling properties such as being heat stable, having a moderate vapor pressure at room temperature and easiness in maintaining and controlling their content to a desired range when stored at room temperature.

Generally, to form such a coordinative bond, primary amine compounds are more preferred because they have higher binding ability, but secondary amine compounds and tertiary amine compounds may also be used. Amine compounds in which two or more adjacent amino groups are involved in bonding, such as a 1,2-diamine or 1,3-diamine compound, are also useful. In addition, a chain amine compound containing polyoxyalkyleneamine-based ether type oxy group (—O—) in its chain may also be used. Other than compounds containing a terminal amino group, compounds containing a hydrophilic terminal group, such as hydroxylamine containing a hydroxyl group, e.g., ethanolamine, may also be used.

Typical examples of useful compounds containing a sulfanyl group (—SH) include alkanethiol. Preferred is alkanethiol which forms a coordinative bond with a metal element and is not separated in a normal storing condition of lower than 40° C., and has a boiling point of 60° C. or higher, preferably 100° C. or higher, more preferably 150° C. or higher. At the same time, alkanethiol which can finally be evaporated upon sintering treatment after being separated from the surface of the fine metal particle is preferred, and those having a boiling point of lower than 300° C., generally 250° C. or lower are preferred. For example, useful is alkanethiol containing a C4 to C20, preferably C8 to C18 alkyl group, and having a sulfanyl group (—SH) at an alkyl chain terminal. For example, C8 to C18 alkanethiols described above are preferably used in view of their handling properties such as being heat stable, having a moderate vapor pressure at room temperature, and easiness in maintaining and controlling their content to a desired range when stored at room temperature. Generally, primary thiol compounds are more preferred because they have higher binding ability, but secondary thiol compounds and tertiary thiol compounds may also be used. Thiol compounds in which two or more sulfanyl groups (—SH) are involved in bonding, such as a 1,2-dithiol compound, are also useful.

Typical examples of useful compounds containing a hydroxyl group include alkanediol. Examples thereof include glycols such as ethylene glycol, diethylene glycol and polyethylene glycol. Preferred is alkanediol which forms a coordinative bond with a metal element and is not separated in a normal storing condition of lower than 40° C., and has a boiling point of 60° C. or higher, usually 100° C. or higher, more preferably 150° C. or higher. At the same time, alkanediol which can finally be evaporated upon sintering after being separated from the surface of the fine metal particle is preferred, and those having a boiling point of lower than 300° C., usually 250° C. or lower are preferred. For example, compounds in which two or more hydroxyl groups are involved in bonding, such as a 1,2-diol compound, are more preferably used.

Since fine metal particles are used for preparing a sintered product conductor layer in the present invention, the fine metal particles are preferably fine metal particles of a metal species selected from the group consisting of gold, silver, copper, platinum, palladium, tin, nickel, aluminum, zirconium, titanium, iron and tungsten, or fine alloy particles composed of two or more metals selected from the metal species group. In the case of fine metal oxide particles having an oxide film layer on the surface as well, fine metal particles used as a raw material are preferably fine metal particles of a metal species selected from the group consisting of gold, silver, copper, platinum, palladium, tin, nickel, aluminum, zirconium, titanium, iron and tungsten, or fine alloy particles composed of two or more metals selected from the metal species group.

In particular, for preparing a sintered product conductor layer used for forming fine wiring having good conductive properties by low temperature sintering using the above-described fine metal particles as a raw material, fine metal particles composed of a metal species selected from the group consisting of gold, silver, copper, platinum, palladium and nickel are particularly preferably used. Likewise, for preparing a sintered product conductor layer used for forming fine wiring having good conductive properties by low temperature sintering using, as a raw material, fine metal particles produced by reducing fine metal oxide particles having an oxide film layer on the surface, fine metal particles composed of a metal species selected from the group consisting of silver, copper and nickel are particularly preferably used as a raw material. Other than these uses, the fine metal oxide particles in the form of a dry powder of the present invention may be used for manufacturing various sensors in which metal oxide is used for an active layer. When the fine metal oxide particles are applied to manufacturing various sensors in which metal oxide is used for an active layer, fine metal oxide particles composed of oxide of tin, zinc, aluminum, titanium or tungsten are suitable for operational principles of various sensors.

In addition, regarding fine metal particles or fine metal oxide particles in the form of a dry powder of the present invention, instead of the compound having a group containing a nitrogen atom, an oxygen atom or a sulfur atom and capable of forming a coordinative bond via a lone pair of those atoms as a group capable of forming a coordinative bond with the above-described metal element, also useful are fine metal particles or fine metal oxide particles whose surface is covered with carboxylic acid fixed to the metal surface of a cationic metal atom by a Coulombic interaction, or with a carboxylic acid anion species which forms a salt with the metal cation on the metal surface and fixed in the form of carboxylate. In other words, fine metal particles or fine metal oxide particles used for preparing the fine metal particles or the fine metal oxide particles in the form of a dry powder according to the second embodiment of the present invention which have a covering layer of carboxylic acid fixed by a Coulombic interaction or carboxylate composed of a metal cation species and a carboxylic acid anion species can be prepared by, for example, adding carboxylic acid to a dispersion containing fine metal particles or fine metal oxide particles having alkylamine as a covering agent molecule to separate covering agent molecules such as alkylamine, thereby converting to fine metal particles or fine metal oxide particles having a covering layer of carboxylic acid fixed to the metal surface by a Coulombic interaction or carboxylate composed of a metal cation species and a carboxylic acid anion species instead. In that case, the amount of carboxylic acid added is such that when a coordinative bond is formed with a metal element present on covering agent molecules such as alkylamine contained in a dispersion containing fine metal particles or fine metal oxide particles as a starting material which have covering agent molecules such as alkylamine, a substantially equivalent mole of carboxyl groups present in carboxylic acid are consumed for separation of molecules containing a lone pair on a nitrogen atom, an oxygen atom or a sulfur atom based on 1 mole of the groups containing a lone pair on a nitrogen atom, an oxygen atom or a sulfur atom, and in addition, the excess amount necessary for covering the particles is preferably selected from the range equivalent to 0.8 to 1.2 moles.

Alternatively, when fine metal particles are prepared using a gas evaporation method, by allowing vapor or extremely fine mist of the carboxylic acid to float in the system so that the carboxylic acid directly acts on the surface of the prepared fine metal particles, fine metal particles having a covering layer of carboxylic acid fixed to the metal surface by a Coulombic interaction or carboxylate composed of a metal cation species and a carboxylic acid anion species may be prepared.

In the fine metal particles or fine metal oxide particles in the form of a dry powder whose surface is covered with carboxylic acid, one or more carboxylic acids covering the surface may be present in a proportion of 5 to 35 parts by mass in total based on 100 parts by mass of the fine metal particles or the fine metal oxide particles.

In the second embodiment of the present invention, in the process for forming dry powder of fine metal particles or fine metal oxide particles having a coating layer of carboxylic acid in the form of carboxylic acid fixed to the metal surface by a Coulombic interaction or carboxylate composed of a metal cation species and a carboxylic acid anion species, it is possible to employ a method of evaporating a dispersion solvent, a method of washing using a polar solvent and a method of removing by evaporation and drying of a polar solvent used for washing described below, in order to remove covering agent molecules such as alkylamine, excess carboxylic acid or alkylamine forming an addition salt with carboxylic acid which are released and mixed to the above-described raw material dispersion. Particularly, examples of carboxylic acids used for covering the surface of fine metal particles or fine metal oxide particles in the form of a dry powder according to the second embodiment of the present invention described above include linear carboxylic acids having 2 to 18 carbon atoms, e.g., long chain carboxylic acids having 8 or more carbon atoms such as lauric acid (dodecanoic acid, melting point: 44° C., boiling point: 225° C. (100 mmHg)), myristic acid (tetradecanoic acid, melting point: double melting point of 53.8° C. and 57.5 to 58° C., boiling point: 248.7° C. (100 mmHg)), palmitic acid (hexadecanoic acid, melting point: 63 to 64° C., boiling point: 360° C., 215° C. (15 mmHg)) and stearic acid (octadecanoic acid, melting point: 69 to 70° C., boiling point: 383° C., 232° C. (15 mmHg), gradually volatilized at 90 to 100° C.).

The above-described fine metal particles having, on the surface, a covering agent layer of one or more compounds having a group containing a nitrogen atom, an oxygen atom or a sulfur atom as a group capable of forming a coordinative bond with a metal element are uniformly dispersed in a dispersion solvent. A dispersion solvent composed of one or more organic solvents in which covering agent molecules have relatively low solubility at room temperature is used to prevent dissolution of the covering agent molecules covering the metal surface. Also, excess covering agent molecules are dissolved in the dispersion, preventing dissolution of the covering agent molecules covering the metal surface. For these reasons, by only removing the dispersion solvent, excess covering agent molecules dissolved in the dispersion are concentrated, and fine metal particles having a covering agent layer on the surface are adhered with each other and coagulated in the concentrated solution.

In the case of the fine metal particles in the form of a dry powder according to the first embodiment of the present invention, the excess of covering agent molecules are dissolved in a polar solvent and beforehand removed. Then, in the polar solvent, fine metal particles having a covering agent layer on the surface and having reduced dispersibility are precipitated, thereby smoothly performing solid-liquid separation. Thus, for washing using a polar solvent, one or more polar solvents in which the covering agent molecules have higher solubility than that in the organic solvent is used. For example, as an organic solvent used as the dispersion solvent in which covering agent molecules have a relatively low solubility, a solvent having no or low polarity such as an aromatic hydrocarbon solvent such as toluene or a chain hydrocarbon solvent such as hexane may be preferably used. On the other hand, referring to the polar solvent in which covering agent molecules have higher solubility compared to the relatively low solubility in the organic solvent, a polar solvent in which covering agent molecules have solubility at least 10 times the solubility in the organic solvent is preferably used. Specifically, it is desired that when covering agent molecules have a solubility such that 10 parts by mass or less of the covering agent molecules is dissolved in 100 parts by mass of the organic solvent, a polar solvent in which 100 parts by mass or more of the covering agent molecules can be dissolved at room temperature based on 100 parts by mass of the polar solvent is used.

Examples of useful polar solvents include, in the case where covering agent molecules are the aforementioned compound having a group containing a nitrogen atom, an oxygen atom or a sulfur atom, alcohol solvents, nitrile solvents and ketone solvents suitable for dissolving molecules containing an amino group, a hydroxyl group or a sulfanyl group. When recovering fine metal particles in the form of a dry powder at the last stage, a method in which most of the polar solvent used for washing is removed by solid-liquid separation and the remaining polar solvent is evaporated is employed. It is preferred that the polar solvent is evaporated at 100° C. or lower, and so a low boiling point polar solvent having a boiling point of, for example, about 80° C. or lower is preferably used. On the other hand, in the drying step where remaining polar solvent is finally evaporated, drying is performed at a temperature at which one or more compounds having a group containing a nitrogen atom, an oxygen atom or a sulfur atom used as covering agent molecules are not separated from the metal surface while the polar solvent can be immediately evaporated.

While excess covering agent molecules are removed by performing the aforementioned washing using the polar solvent, in order to leave the necessary covering agent molecule layer on the surface of the fine metal particle, the covering amount of one or more compounds having a group containing a nitrogen atom, an oxygen atom or a sulfur atom remaining after washing is selected and adjusted in the range of 5 to 35 parts by mass in total of the one or more compounds having a group containing a nitrogen atom, an oxygen atom or a sulfur atom based on 100 parts by mass of the fine metal particles.

More specifically, at least 0.5 nm or more of a covering agent molecule layer is to be present on the surface of fine metal particles having an average particle size of 1 to 100 nm. It is desired that in the case of fine metal particles having an average particle size of 1 nm, 0.5 nm to 1 nm of a covering agent molecule layer is formed, and in the case of fine metal particles having an average particle size of 100 nm, 30 nm or less of a covering agent molecule layer is formed. For example, when an average particle size of the fine metal particles is selected in the range of 1 to 20 nm, it is preferred that a thickness of the covering agent molecule layer is at least 0.5 nm or thicker, and selected in the range of $2/10$ to $8/10$ of the average particle size of the fine metal particles. It is desired that the thickness of the covering agent molecule layer formed on the surface of fine metal oxide particles is also selected from the aforementioned range.

In the case of the fine metal oxide particles in the form of a dry powder according to the first embodiment of the present invention as well, basically the same processes and configurations as in the case of the fine metal particles in the form of a dry powder according to the first embodiment of the present invention are employed.

In the process for forming a conductive wiring pattern and the process for forming a conductive thin film according to the first embodiment of the present invention, after drawing a coated film of fine metal particles in the form of a dry powder, fine metal particles having an average particle size selected in the range of 1 to 100 nm are contacted with each other while maintaining a clean metal face being exposed on the surface, and by sintering the particles by heating to at least 150° C. or higher but lower than 350° C., the aimed closely packed sintered product layer of fine metal particles is formed. Accordingly, it is desired that heating is performed, for example, in an inert gas atmosphere or a reducing atmosphere, preventing generation of oxide film on the surface of the fine metal particle.

On the other hand, in the process for forming a conductive wiring pattern and the process for forming a conductive thin film according to the first embodiment of the present invention, in the step of reducing the metal oxide film layer present on the fine metal oxide particle surface after drawing a coated film of fine metal oxide particles having a metal oxide film on the surface, the reduction reaction of the metal oxide on the surface proceeds rapidly even at such a low heating temperature by heating at a heating temperature selected from at least 180° C. or higher but 350° C. or lower in the presence of gas or vapor of a compound having reducing ability, e.g., an organic compound having reducing ability. Due to a solid phase reaction between non-oxidized metal atoms once formed on the surface and metal oxide molecules present inside, the metal oxide in the inside is converted to non-oxidized metal atoms, and instead metal oxide is formed on the surface. The metal oxide formed on the surface is reduced to non-oxidized metal atoms by the reducing action of the organic compound having reducing ability continuously supplied. As the aforementioned series of reaction cycles is repeated, the metal oxide film layer which has initially reached deep inside a fine metal oxide particle gradually decreases, and finally the whole fine particle is reduced to a fine metal particle.

If reduced fine metal particles are again left in the air and brought into contact with oxygen molecules in the air for a long time, reoxidation of the surface takes place. In the process for forming a conductive wiring pattern according to the first embodiment of the present invention, clean surfaces of reproduced fine metal particles are closely contacted at a heating temperature selected from at least 180° C. or higher but 350° C. or lower in the presence of gas or vapor of an organic compound having reducing ability without contacting with air again for a long time, and therefore sintering proceeds rapidly at a relatively low temperature, whereby a closely packed sintered product layer of reproduced fine metal particles are formed in the entire coated layer. As shown in Examples described later, a sintered product may be gradually formed by an oxidation/re-reduction process in which the particles are contacted with oxygen molecules for a very short time after reduction is once finished and then subjected to re-reduction.

Specifically, in the process for forming a conductive wiring pattern using the fine metal oxide particles in the form of a dry powder according to the first embodiment of the present invention, it is desired that the average particle size of the fine particles used is consequently selected from the range in which sintering can proceed rapidly even at a heating temperature selected from at least 180° C. or higher but 350° C. or lower when closely contacting clean surfaces of the reproduced fine metal particles. In view of this, the average particle size of the used fine metal oxide particles having a metal oxide film layer on the surface is selected in the range of 1 to 100 nm, more preferably 1 to 20 nm.

Further, in the second embodiment of the present invention as well, when forming a conductive wiring pattern using fine metal particles or fine metal oxide particles having a covering layer of the above-described carboxylic acid in the form of carboxylic acid fixed to the metal surface by a Coulombic interaction or carboxylate composed of a metal cation species and a carboxylic acid anion species as the fine metal particles or the fine metal oxide particles in the form of a dry powder of the present invention, necessary are a process for separating carboxylic acid fixed to the metal surface by a Coulombic interaction from the metal surface, or separating carboxylic acid anions by once converting carboxylate composed of a metal cation species and a carboxylic acid anion species to carboxylic acid, and simultaneously, a process for reducing the metal cation species to a metal atom. These processes can be performed by a process similar to reduction of fine metal oxide particles under a reducing atmosphere. Specifically, after carboxylate $((-COO^-)_2M^{2+})$ is disproportionated to carboxylic anhydride (—C(=O)—O—C(=O)—) and metal oxide (MO), the metal oxide (MO) can be reduced to a metal atom (M). Simultaneously, carboxylic anhydride (—C(=O)—O—C(=O)—) also undergoes reduction and turns to, for example, aldehyde (—CHO), and then is separated from the metal surface.

Meanwhile, as a method of drawing a coated layer containing fine metal oxide particles or fine metal particles in the form of a dry powder into a desired wiring pattern on the substrate, a dry printing method is used. In this process, the surface of the fine metal oxide particles or the fine metal particles in the form of a dry powder is covered with one or more compounds having a group containing a nitrogen atom, an oxygen atom or a sulfur atom and capable of forming a coordinative bond via a lone pair of those atoms as a group capable of forming a coordinative bond with a metal element contained in the fine metal particles or the fine metal oxide particles, at an appropriate covering ratio. Generally, the surface of a substrate material is coated with particles using a solid binder resin at room temperature. As the solid binder resin, those having a high adhesiveness to the substrate material surface and a sufficient adhesiveness to a metal material are used. In addition, by selecting a solid binder resin having affinity to the covering agent compound covering and protecting the surface of fine metal particles or fine metal oxide particles, the fine metal particles or the fine metal oxide particles in the form of a dry powder can be formed into a uniform coated layer of a desired layer thickness.

For the aforementioned dry printing method, an electrophotographic image printing method suitable for continuously forming a coated layer of powdery particles having an identical pattern at high reproducibility can be preferably used. In the electrophotographic image printing method, for example, a negatively charged photoreceptor is exposed to light, thereby leaving charged regions in the shape of the intended pattern, and toner particles are electrostatically adhered to the regions, and then toner particle images are transferred to the intended substrate surface by removing the static charge. To fix the transferred toner particle image, a process for softening a solid binder resin contained in the toner particle by heating, a process for pressure welding by pressurizing using a roller or the like is generally performed. For this reason, fine metal particles or fine metal oxide particles in the form of a dry powder are formed into toner particles using a binder resin for toner. An average particle size of the toner particles is selected in the range of 0.1 μm to 10 μm. More specifically, fine metal particles or fine metal oxide particles in the form of a dry powder and a binder resin for toner are mixed and when the fine metal particles or the fine metal oxide particles in the form of a dry powder are uniformly mixed with the binder resin, the mixture is pulverized or formed into powder having the aforementioned average particle size. On the other hand, it is preferred that for preparing toner particles, 1 to 20 parts by mass of a binder resin is added based on 100 parts by mass of the fine metal particles or the fine metal oxide particles in the form of a dry powder. Generally, styrene-acrylic resin can be used as a binder resin for toner, and those having a softening point of 80° C. to 230° C. may be preferably used. For example, a styrene-acrylic resin, a polyester resin and an epoxy resin which have good adhesiveness to film-shaped polyimide resin used as a substrate material may be used. In this connection, in the fixing step, toner particles are heated at a temperature slightly higher than the softening point of the used binder resin for toner, e.g., 100° C. to 250° C., while the linear pressure of a roller upon pressurization by the roller is preferably selected in the range of 1 kgf/cm to 20 kgf/cm.

Further, by adding metal powder having a larger average particle size in addition to fine metal particles or fine metal particles obtained by reducing fine metal oxide particles, the sintered product conductor layer may also be formed as an integral sintered product conductor layer in which spaces between metal powder particles having a higher average particle size are filled with the fine metal particles. In that case, the metal powder having a larger average particle size used together is preferably added as part of the core particle together with fine metal particles or fine metal oxide particles in the form of a dry powder wherein, upon preparation of toner particles after removing surface oxide film. In other words, when preparing toner particles, fine metal particles or fine metal oxide particles in the form of a dry powder and metal powder having a larger average particle size are uniformly mixed, achieving a mixed state in which fine metal particles or fine metal oxide particles in the form of a dry powder having a smaller average particle size are closely filled in the spaces between metal powder particles having a larger average particle size. As a result, regarding the prepared sintered product conductor layer, sintering is performed in a state in which the spaces between metal powder particles having a larger average particle size are closely filled with fine metal particles, whereby the fine metal particles are fused to the surface of the metal powder and a sintered product structure in which the fine metal particles are closely packed is formed. More specifically, when a sintered product structure in which fine metal particles are closely packed so as to enclose the metal powder used together is formed, the bulk volume of the sintered product structure of fine metal particles is decreased, and due to the decrease in the bulk volume, an electrically conductive path can be formed between metal powder particles in the entire sintered product conductor layer by close contact with the sintered product structure of fine metal particles filling the spaces between the metal powder particles.

The average particle size of the metal powder having a larger average particle size used together with the fine metal particles or the fine metal oxide particles in the form of a dry powder is selected based on the film thickness and the minimum line width of the sintered product conductor layer finally prepared. Specifically, to maintain a uniform film thickness and uniform pattern line width, it is preferred that the average particle size of the metal powder having a larger average particle size used together is selected in the range of ½ or less of the intended film thickness of the sintered product conductor layer or ⅕ or less of the minimum line width thereof, more preferably 1/100 to ⅕ of the intended film thickness or 1/100 to ⅕ of the minimum line width. On the other hand, for a metal material constituting the metal powder, used together generally, a metal species the same as the metal species constituting the fine metal particles or the fine metal oxide particles in the form of a dry powder to be used, or a metal species which can form a uniform alloy upon sintering is preferably selected. Further, regarding the mixing ratio of the metal powder having a larger average particle size used together to the fine metal particles or the fine metal oxide particles in the form of a dry powder when preparing toner particles, the total volume ratio of the fine metal particles or the fine metal oxide particles in the form of a dry powder is selected in the range of at least 5, preferably 10 to 1000 based on the total volume 100 of the metal powder having a larger average particle size. It is preferred that 1 to 20 parts by mass of a binder resin is added based on 100 parts by mass in total of the fine metal particles or the fine metal oxide particles in the form of a dry powder and the metal powder having a larger average particle size used together. At the same time, the average particle size of the toner particles is obviously larger than the average particle size of the metal powder used together to ensure that the metal powder is mixed with the toner particles. Therefore, an average particle size of the toner particles is preferably selected in the range of 2 to 100 times the average particle size of the metal powder used together.

Even if the aforementioned binder resin for toner is not used, since the surface of the fine metal particles or the fine metal oxide particles in the form of a dry powder of the present invention is thickly covered with covering agent molecules, the particles can be electrostatically attached to the surface of a charged photoconductor drum. By removing the static charge thereafter, the fine metal particles or the fine metal oxide particles in the form of a dry powder can be transferred to the surface of the target substrate material. The fine metal particles or the fine metal oxide particles in the form of a dry powder transferred to the substrate surface are in a stacked state, and by pressure welding by pressurizing using a roller or the like under heating, the covering agent molecules covering the surface of the fine metal particles or the fine metal oxide particles are partly fused, and the covering agent molecules in a fused state can also be fixed to the substrate surface. The heating temperature necessary for attaining fusion of covering agent molecules and fusion of covering agent molecules to the substrate surface means a temperature at which the used covering agent molecules are partly separated and can form a bulk phase, and a temperature significantly lower than the boiling point at which most of the molecules can be vaporized/evaporated after separation is selected. The heating temperature for this process is generally selected in the range of 60° C. or higher but 220° C. or lower. In other words, in the aforementioned temperature range, while covering agent molecules starts to be separated in some parts, the surface of the fine particles can substantially remain covered with covering agent molecule. On the other hand, in pressurization by a roller performed simultaneously with heating, the linear pressure of the roller is preferably selected in the range of 1 kgf/cm to 20 kgf/cm. After fixation is completed, the fine metal particles or the fine metal oxide particles constituting the coated layer undergo processes similar to the reduction process and the baking processes in the case of the above-described coated layer of toner particles containing a binder resin, whereby a sintered product conductor layer of fine metal particles can be formed.

In this regard, the sintered product conductor layer can be fixed to the substrate surface by the covering agent molecules remaining after a series of heating processes which are coagulated near the surface of a substrate composed of a heat resistant resin film, serving as an adhesive layer. Accordingly, for drawing and fixing a coated layer of the fine metal particles or the fine metal oxide particles in the form of a dry powder using an electrophotographic image printing method and finally forming a sintered product conductor layer fixed to the substrate surface, it is necessary that the used covering agent molecules are coagulated near the substrate surface and serve as an adhesive layer even after the reduction process and the heating process in baking. It is preferable to select covering agent molecules having a boiling point being in the range of 100° C. to 300° C. which are partly vaporized/evaporated upon the reduction process and the heating process in baking but can be mostly present in the form of liquid even at the heating temperature. Specifically, in the fine metal particles or the fine metal oxide particles in the form of a dry powder of the present invention, the covering amount of the one or more compounds used as a covering agent is adjusted by selecting it in the range of 5 to 35 parts by mass in total based on 100 parts by mass of the fine metal particles or the fine metal oxide particles; and the total of the one or more compounds for a covering agent remaining in the finally obtained sintered product conductor layer fixed to the substrate surface is preferably 1 to 10 parts by mass based on 100 parts by mass of the sintered product conductor layer.

When employing an electrophotographic image printing method, the drawing accuracy depends on the accuracy of exposure for photoreceptors and the average particle size of the toner particles used. The layer thickness of the toner particle coated layer formed by drawing depends on the amount of toner particles transferred per unit area, and may be generally adjusted to 2 times to 100 times the average particle size of toner particles. Therefore, in the process for forming a conductive wiring pattern of the present invention, by using an electrophotographic image printing method, conditions can be selected from a drawing accuracy equivalent to 1200 DPI or higher and a layer thickness of toner particle coated layer of 10 μm to 200 μm.

After completing the above-described drawing of a wiring pattern using the toner particles containing the fine metal oxide particles, the wiring board is heated, for example, in a heating (reduction, baking) apparatus shown in FIG. 1 in the presence of a compound having reducing ability at a heating temperature selected at least from 180° C. or higher but 350° C. or lower so as to perform the aforementioned reduction process and the baking process, whereby the oxide film on the surface is reduced by a compound having reducing ability as a reducing agent. The compound having reducing ability usable as a reducing agent means a compound capable of reducing the target metal oxide to metal at the aforementioned heating temperature, and various compounds may be used as long as they are present in the form of vapor having a sufficient vapor pressure (partial pressure) at the aforementioned heating temperature. Of the compounds having reducing ability usable in the present invention, preferred examples of organic compounds having reducing ability include organic compounds containing a hydroxyl group that can be converted to an oxo group (═O) or a formyl group (—CHO) by oxidation, and two or more of them may be used together according to need. In particular, more preferred examples include organic compounds containing two or more hydroxyl groups. Specific examples of organic compounds having reducing ability usable in the present invention include aliphatic mono-alcohols such as methyl alcohol, ethyl alcohol, isopropyl alcohol (boiling point: 82.4° C.), 2-butyl alcohol and 2-hexyl alcohol, aliphatic polyhydric alcohols such as ethylene glycol, propylene glycol (1,2-propanediol, boiling point: 187.85° C.), glycerol (1,2,3-propanetriol; boiling point: 290.5° C. (decomposed)), 1,2-butanediol and 2,3-butanediol (meso structure, boiling point: 181.7° C. (742 mmHg)), alicyclic polyhydric alcohols such as 1,2-cyclohexanediol (cis-structure, boiling point: 116° C. (13 mmHg)), aromatic mono-alcohols such as benzyl alcohol, 1-phenylethanol, diphenylcarbitol and benzoin, and aromatic polyhydric alcohols such as hydrobenzoin (boiling point: 285° C. (730 mmHg)). In addition, of the compounds having reducing ability usable in the present invention, preferred examples of inorganic compounds having reducing ability which can be supplied from the gas phase include hydrogen ($H_2$) and hydrazine ($N_2H_4$; boiling point 113.5° C.). Examples of low boiling point organic compounds having reducing ability include formaldehyde (HCHO; boiling point −19.5° C.).

Further, epoxy compounds that can be converted to 1,2-diol compounds or oxetane compounds that can be converted to 1,3-diol compounds by the reaction with water remaining in the system during the heating process can also be used as long as water which induces the reaction remains or is continuously produced by a reduction reaction. Moreover, aromatic hydroquinones such as hydroquinone can also be used as a reducing agent. These organic compounds containing a hydroxyl group exhibit action of gradually reducing metal in oxide to a small oxidation number, utilizing a reaction of converting the hydroxyl group (—OH) to an oxo group (═O) or a formyl group (—CHO) by oxidation under heating.

On the other hand, it is preferred that a reaction by-product which is derived from the organic compound containing a hydroxyl group and produced as a result of conversion from the hydroxyl group (—OH) to an oxo group (=O) or a formyl group (—CHO) by oxidation under heating can be removed by evaporation and vaporization.

In the reduction process, the inorganic compound having reducing ability or the organic compound having reducing ability used as a reducing agent is supplied form the gas phase, and while heating to a pre-determined heating temperature, the compound is allowed to act on the fine metal oxide particle surface to cause reduction. It is desired that an inorganic compound having reducing ability such as hydrogen ($H_2$) or hydrazine ($N_2H_4$; boiling point 113.5° C.) is supplied to the atmosphere in the form of mixed gas with inert gas so that the gas molecules has a desired partial pressure at the aforementioned heating temperature. The inorganic compound having reducing ability supplied from the gas phase is mainly directly introduced into the entire coated layer by a mechanism in which the compound reaches the inside of the coated layer through the spaces between fine metal oxide particles in the coated layer.

Likewise, regarding the organic compound having reducing ability present during the heating process, it is preferred that the organic compound having reducing ability is supplied to the atmosphere for the heating process in the form of vapor, while maintaining the partial pressure. Since the organic compound having reducing ability is consumed in the above-described reduction process, it is necessary that the organic compound having reducing ability is supplied based on at least the total amount of the metal oxide film to be reduced which is contained in the fine metal oxide particles having a metal oxide film layer on the surface. Further, when the organic compound having reducing ability is supplied in the form of vapor, it is necessary to select an appropriate partial pressure and an appropriate amount of vapor supplied per unit time based on the heating temperature at which reduction of the metal oxide film is performed. Regarding the organic compound having reducing ability supplied from the gas phase, in addition to supplying the compound by a mechanism in which the compound reaches the inside of the coated layer through the spaces between fine metal oxide particles in the coated layer, a mechanism in which the compound reaches the fine metal oxide particles by being partly dissolved in the softened or melted binder resin contained in the coated layer also contributes to the supply process.

Further, when supplying the organic compound having reducing ability in the form of vapor, it is preferred that the compound is supplied in the form of vapor in such an amount that the proportion of hydroxyl groups (—OH) in the organic compound having reducing ability which undergo oxidation is 1 to 50 moles based on the total weight equivalent to 1 mole of the metal species of the fine metal oxide particles having a metal oxide film layer on the surface contained in the coated layer. Alternatively, the vapor pressure of the organic compound having reducing ability present in the atmosphere for the heating process is preferably selected so that it falls into the range of 100 to 2000 hPa.

In addition, it is preferable to maintain the atmosphere for the heating process for baking to be, for example, atmosphere of inert gas such as nitrogen so as to prevent re-oxidation of the surface of the fine metal particle once reduced.

The temperature for the heating process should be accordingly selected in consideration of the reactivity of the used organic compound having reducing ability, and is preferably selected in the range of 350° C. or lower, for example, 180° C. or higher, and generally 250° C. or higher. The temperature is adjusted and determined so that the temperature is maintained within the range appropriate for the heat resistance of the material of the printed board disposed in the equipment, i.e.,  300° C. or lower, for example, 180° C. to 300° C. Although depending on the aforementioned preset temperature and the concentration, the vapor pressure and the reactivity of the reducing agent, the time for the reduction and the baking may be selected in the range of 1 minute to 1 hour, preferably 5 minutes to 30 minutes. The preset temperature and the time are accordingly selected in consideration of the thickness of the metal oxide film layer covering the fine metal oxide particle surface and the time required for reducing the same.

For drawing a wiring pattern using toner particles containing fine particles by an electrophotographic image printing method, the minimum line width of a drawable wiring pattern is 10 µm to 200 µm, practically 20 µm to 100 µm, and the corresponding minimum line space is 10 µm to 200 µm, practically 20 µm to 100 µµm. A uniform line width and good reproducibility can be attained in this range. In addition, the obtained wiring layer is a sintered product layer of fine metal particles without an oxide film at the interface, and the volume resistivity at the aforementioned minimum line width can be $30 \times 10^{-6}$ Ω·cm or less, or in most cases $10 \times 10^{-6}$ Ω·cm or less, attaining good conductive properties. When using an electrophotographic image printing method of drawing, the conductor thin film that can be formed may have an average film thickness selected in the range of 7 µm to 150 µm, practically 10 µm to 100 µm, and good surface flatness and uniformity in the film thickness can be attained at high reproducibility.

Since the fine metal particles in the form of a dry powder or the fine metal oxide particles according to the first embodiment of the present invention have an advantage that they can be used in the form of extremely fine particles in a good dispersion state, the particles can be used for preparing, for example, a fine metal particle dispersion or a fine metal oxide particle dispersion adjusted to a desired dispersion concentration and liquid viscosity by uniformly dispersing in a dispersion solvent having a high boiling point again. For example, when forming a ultrafine wiring pattern using a fine metal particle dispersion or a fine metal oxide particle dispersion, a dispersion having a liquid viscosity appropriate for the drawing method to be used needs to be prepared. Specifically, when using screen printing, to suppress blurring after drawing within an acceptable range, it is desired that the liquid viscosity of the dispersion is adjusted to 50 to 200 Pa·s (25° C.). On the other hand, when using inkjet printing, to be able to spray desired fine droplets through an outlet having a small bore diameter, it is desired that the liquid viscosity of the dispersion is adjusted to 5 to 30 mPa·s (25° C.).

Further, in both cases of using screen printing and inkjet printing, when the liquid viscosity increases due to rapid evaporation of a dispersion solvent used from the dispersion used for printing, it becomes difficult to maintain uniform drawing accuracy. In other words, it is desired to use a dispersion solvent having a low vapor pressure whose evaporation amount from the dispersion used in printing in which it is contained can be kept small. More specifically, it is desired that a dispersion contains a dispersion solvent having a high boiling point of at least 100° C. or higher, preferably 150° C. or higher. On the other hand, when forming a ultrafine wiring pattern using a fine metal particle dispersion or a fine metal oxide particle dispersion, the dispersion solvent is evaporated and the fine metal oxide particles are reduced in the process of heating a dispersion coating layer, and finally, sintering of the fine metal particles is completed. Accordingly, it is desired that the used dispersion solvent can be rapidly evaporated at the temperature in the aforementioned heating process, and has a boiling point of at most 300° C. or lower, preferably 250° C. or lower.

As described above, regarding the fine metal particle dispersion according to the first embodiment of the present invention, fine metal particles whose surface is covered with one or more compounds having a group containing a nitrogen atom, an oxygen atom or a sulfur atom as a group capable of forming a coordinative bond with a metal element contained in the fine metal particles are once formed into fine metal particles in the form of a dry powder according to the first embodiment of the present invention, and then dispersed in a dispersion solvent suitable for the intended use at a dispersion concentration which provides a dispersion having a desired liquid viscosity. For example, when screen printing is used for drawing a fine wiring pattern, it is preferred that a high boiling point solvent having a boiling point of 100° C. or higher but 300° C. or lower is used as a dispersion solvent for re-dispersing the fine metal particles in the form of a dry powder according to the first embodiment of the present invention, and the content of the dispersion solvent is selected in the range of 3 to 25 parts by mass, preferably 5 to 20 parts by mass based on 100 parts by mass of the fine metal particles, thereby adjusting the viscosity of the fine metal particle dispersion to be obtained in the range of 50 to 200 Pa·s (25° C.), giving a metal particle dispersion in the form of paste. Alternatively, when screen printing is used for drawing a fine wiring pattern, it is preferred that a high boiling point solvent having a boiling point of 100° C. or higher but 300° C. or lower is used as a dispersion solvent for re-dispersing the fine metal oxide particles in the form of a dry powder according to the first embodiment of the present invention, and the content of the dispersion solvent is selected in the range of 3 to 25 parts by mass, preferably 3 to 15 parts by mass based on 100 parts by mass of the fine metal oxide particles, thereby adjusting the viscosity of the fine metal oxide particle dispersion to be obtained to 50 to 200 Pa·s (25° C.), giving a metal oxide particle dispersion in the form of paste.

On the other hand, when using inkjet printing for drawing a fine wiring pattern, it is preferred that a high boiling point solvent having a boiling point of 100° C. or higher but 300° C. or lower is used as a dispersion solvent for re-dispersing the fine metal particles in the form of a dry powder according to the first embodiment of the present invention, and the content of the dispersion solvent is selected in the range of 30 to 80 parts by mass, preferably 40 to 80 parts by mass based on 100 parts by mass of the fine metal particles, thereby adjusting the viscosity of the fine metal particle dispersion to be obtained to 5 to 30 mPa·s (25° C.), giving a high fluidity fine metal particle dispersion. Alternatively, when using inkjet printing for drawing a fine wiring pattern, it is preferred that a high boiling point solvent having a boiling point of 100° C. or higher but 300° C. or lower is used as a dispersion solvent for re-dispersing the fine metal oxide particles in the form of a dry powder according to the first embodiment of the present invention, and the content of the dispersion solvent is selected in the range of 30 to 70 parts by mass, preferably 40 to 65 parts by mass based on 100 parts by mass of the fine metal oxide particles, thereby adjusting the viscosity of the fine metal oxide particle dispersion to be obtained to 5 to 30 mPa·s (25° C.), giving a high fluidity fine metal oxide particle dispersion.

In the fine metal particles in the form of a dry powder or the fine metal oxide particles in the form of a dry powder according to the first embodiment of the present invention, the compound for covering agent used for fine metal particles having a surface covering layer or fine metal oxide particles having a surface covering layer contained in a dispersion of starting material can be exchanged with another compound for covering agent in the preparation process. Further, when preparing a dispersion by re-dispersing the fine metal particles in the form of a dry powder or the fine metal oxide particles in the form of a dry powder according to the first embodiment of the present invention, a dispersion solvent different from the dispersion solvent that has been used for the dispersion of starting materials may be used. Accordingly, by changing the compound for covering agent and selecting the re-dispersion solvent, the kind and the covering amount of the compound for covering agent used for the fine metal particles having a surface covering layer or the fine metal oxide particles having a surface covering layer contained in a dispersion obtained by re-dispersing the fine metal particles in the form of a dry powder or the fine metal oxide particles in the form of a dry powder according to the first embodiment of the present invention can be made optimal for the dispersion solvent used for re-dispersion.

When changing the compound for covering agent used for fine metal particles having a surface covering layer or fine metal oxide particles having a surface covering layer contained in the dispersion of starting materials to another compound for covering agent, preferably used as other compounds for covering agent are diamines including diamine compounds having an alkyl substituent on an amino group, such as dibutylaminopropylamine and bis-(2-ethylhexyl) aminopropylamine, hydroxyamines including hydroxyamine compounds having an O-alkyl substituent, such as butoxypropylamine and 2-ethylhexyloxypropylamine, and monoamines containing a branched alkyl group, such as bis-2-ethylhexylamine and 2-ethylhexylamine. For example, change from amines containing a linear alkyl group to amines containing a branched alkyl group, change from monoalkylamines to dialkylamines or change from monoamines to the aforementioned diamines or hydroxyamines is desired. It is desired that after changing to the aforementioned other compound for covering agent, a dispersion is prepared preferably using a non-polar or low-polar solvent having a boiling point of 200° C. to 300° C. as a solvent for re-dispersion. In this regard, for a non-polar or low-polar solvent having a boiling point of 200° C. to 300° C. usable as a solvent for re-dispersion, for example, saturated hydrocarbon having 12 to 18 carbon atoms and containing a long chain alkane, such as tetradecane (boiling point 253.57° C.) or hydroxy-substituted saturated hydrocarbon having 9 to 16 carbon atoms and containing long chain alkanol, such as 1-decanol (boiling point 233° C.) is preferably selected.

Further, in the process for forming a conductive wiring pattern of the present invention, in addition to the dry applying process or electrophotographic image printing method described above, a technique using screen printing or inkjet printing may also be applied for drawing the aforementioned fine wiring pattern. More specifically, after forming a fine metal particle dispersion coating layer having a desired wiring pattern by using the fine metal particle dispersion in the form of paste suitable for screen printing according to the first embodiment of the present invention or the high fluidity fine metal particle dispersion suitable for inkjet printing according to the first embodiment of the present invention, a heating process is performed at a temperature no higher than 350° C. With this heating process, the high boiling point solvent contained in the fine metal particle dispersion coating layer is evaporated and removed, and simultaneously, the fine metal particles contained in the fine metal particle dispersion coating layer are sintered. Specifically, upon heating up in the baking treatment, the compound having a group containing a nitrogen atom, an oxygen atom or a sulfur atom covering the surface of the fine metal particle is separated from the surface of the fine metal particle, allowing surface contact of the fine metal particles, whereby the fine metal particles are sintered and a sintered product layer of fine metal particles having good conductivity is formed.

Further, after forming a fine metal oxide particle dispersion coating layer having a desired wiring pattern by using the fine metal oxide particle dispersion in the form of paste suitable for screen printing according to the first embodiment of the present invention or the high fluidity fine metal oxide particle dispersion suitable for inkjet printing according to the first embodiment of the present invention, a heating process is performed at a temperature no higher than 350° C. in a reducing atmosphere. With this heating process in a reducing atmosphere, the high boiling point solvent contained in the fine metal oxide particle dispersion coating layer is evaporated and removed, and liquid, gas or vapor of a compound having reducing ability is allowed to act on the fine metal oxide particles contained in the coating layer to reduce the surface of the fine metal oxide particles, thereby converting to the corresponding fine metal particles. Specifically, through this heating process, the compound having a group containing a nitrogen atom, an oxygen atom or a sulfur atom covering the fine metal oxide particle surface is separated from the fine metal oxide particle surface, and with the progress of evaporation of the compound together with the high boiling point solvent contained in the coating layer, surface contact of the fine metal particles reproduced in the reduction process is attained, whereby the fine metal particles are sintered.

In the fine metal oxide particle dispersion according to the first embodiment of the present invention, it is preferable to use a high boiling point solvent which can be used as a reducing agent in the reduction process of the fine metal oxide particles as a dispersion solvent used for re-dispersion. For example, of the compounds having reducing ability usable for the reduction of fine metal oxide particles in the present invention described above, an organic compound containing a hydroxyl group which can be converted to an oxo group (═O) or a formyl group (—CHO) by oxidation usable as a dispersion solvent having a high boiling point, which is described as a preferred example of the organic compounds having reducing ability, can be used. For example, aliphatic alcohol having boiling point of 100° C. or higher but 300° C. or lower, in particular, long chain alcohol having 4 to 14 carbon atoms such as 1-decanol (melting point 6.88° C., boiling point 232° C.) can be preferably used. A polar solvent in which the compound having a group containing a nitrogen atom, an oxygen atom or a sulfur atom covering the fine metal oxide particle surface can be easily dissolved is generally undesirable as a re-dispersion solvent even if the solvent has a boiling point within the intended range.

On the other hand, in the fine metal oxide particle dispersion according to the first embodiment of the present invention as well, a polar solvent in which a compound having a group containing a nitrogen atom, an oxygen atom or a sulfur atom covering the surface of the fine metal particle can be easily dissolved is generally undesirable as a dispersion solvent used for re-dispersion even if the solvent has a boiling point within the intended range. Thus, a non-polar solvent having a boiling point of 100° C. or higher but 300° C. or lower, for example, a chain hydrocarbon solvent such as tetradecane (melting point 5.86° C., boiling point 253.57° C.) and commercially available solvents such as AF7 (boiling point 259 to 282° C., available from Nippon Oil Corporation) and terpineol (boiling point 217 to 218° C.) may be preferably used.

In the process for forming a conductive wiring pattern of the present invention, upon application of a technique using screen printing or inkjet printing for drawing a fine wiring pattern, the minimum line width/space width of a fine wiring pattern drawable at a high reproducibility is different in screen printing and inkjet printing. When screen printing is employed, it is desired that the coating film thickness of the paste dispersion to be applied is selected in the range of 5 μm to 30 μm, and the corresponding minimum width/space width of a fine wiring pattern drawable at a high reproducibility is in the range of 20 μm/20 μm to 500 μm/500 μm. When inkjet printing is employed, fine droplets of a high flowability dispersion are applied in the form of a spot, and the spotted coatings are overlapped to constitute the entire drawing shape in a coating film thickness. Accordingly, the drawing accuracy depends on the spot shape of fine droplets, for example, the spot diameter. Generally, when inkjet printing is employed, the minimum line width/space width of a fine wiring pattern drawable at good dimensional accuracy and high reproducibility is in the range of 1 μm/1 μm to 500 μm/500 μm. On the other hand, the coating film thickness formed by the overlapped spotted coatings is in the range of 2 μm to 30 μm. The coating film of the dispersion formed by inkjet printing contains a large amount of a dispersion solvent. The dispersion solvent is finally vaporized, and the film thickness of the sintered product layer to be formed is generally about 1/5 to 1/20 of the film thickness of the dispersion coating film.

EXAMPLES

In the following, the present invention is described in more detail with reference to Examples. Although these Examples illustrate the best mode of the present invention, the present invention is not limited by these Examples.

Example 1

Fine silver particles in the form of a dry powder were prepared from a fine silver particle dispersion by the following procedure.

As a raw material for fine silver particles, a commercially available ultrafine silver particle dispersion (product name: Independently Dispersed Ultrafine Particle Ag1T available from Vacuum Metallurgical Co., Ltd.), specifically, a dispersion of fine silver particles having an average particle size of 3 nm containing 35 parts by mass of ultrafine silver particles, 7 parts by mass of dodecylamine (molecular weight 185.36, boiling point 248° C.) as alkylamine and 58 parts by mass of toluene as an organic solvent was used.

500 g of the ultrafine silver particle dispersion Ag1T (containing 35 wt % of Ag) and 87.5 g (50 wt % based on solid content of Ag) of dibutylaminopropylamine (boiling point 238° C., available from KOEI CHEMICAL CO., LTD.) were put and mixed in a 1 L round bottom flask, and the mixture was heated with stirring at 80° C. for 1 hour. After completion of the stirring, the solvent toluene contained in the Ag1T was removed by vacuum concentration.

The mixture from which the solvent was removed was transferred to a 2 L beaker and 1,000 g of a polar solvent, methanol, was added thereto. The mixture was stirred at room temperature for 3 minutes and then allowed to stand. In the above process, fine silver particles precipitated at the bottom of the beaker when methanol was added and the mixture was stirred and allowed to stand. On the other hand, unnecessary organic components contained in the mixture were dissolved in the supernatant, giving a brown methanol solution. After removing the supernatant layer, 800 g of methanol was again added to the precipitate, and the mixture was stirred and allowed to stand. After the fine silver particles precipitated, the methanol supernatant layer was removed. While observing the coloring state of the supernatant methanol layer, 500 g of methanol was further added to the precipitate, and the same procedure was repeated. Subsequently, 300 g of methanol was added to the precipitate, and when the mixture was stirred and allowed to stand, coloring was no longer found in the visual observation of the supernatant methanol layer. After removing the supernatant methanol layer, the methanol solution remaining in the fine silver particles precipitated at the bottom of the beaker was volatilized, and when the precipitate was dried, blue fine powder was obtained. In this dry powder, the above amine compound remained on the fine silver particle surface in the form of a covering layer which is a sort of a single molecular layer, while the excess amine compound was removed by washing using methanol. The dry powder contained 82% by mass of fine silver particles and 18% by mass in total of the amine compound as the surface covering layer.

In other words, the obtained dry powder is fine particles of silver (density: 10.500 g/c) whose surface is covered with dibutylaminopropylamine (density: 0.827 g/cm$^3$), which are fine silver particles having an average particle size of 3 nm, on the surface of which a dibutylaminopropylamine covering layer having an average thickness of 1.7 nm is formed.

Example 2

Fine gold particles in the form of a dry powder were prepared from a fine gold particle dispersion by the following procedure.

As a raw material for fine gold particles, commercially available ultrafine gold particle dispersion (product name: Independently Dispersed Ultrafine Particles Au1T available from Vacuum Metallurgical Co., Ltd.), specifically, a dispersion of fine gold particles having an average particle size of 5 nm containing 30 parts by mass of ultrafine gold particles, 7 parts by mass of dodecylamine (molecular weight 185.36, boiling point 248° C.) as alkylamine and 63 parts by mass of toluene as an organic solvent was used.

300 g of the ultrafine gold particle dispersion Au1T (containing 30 wt % of Au) and 45 g (50 wt % based on solid content of Au) of 2-ethylhexylamine (boiling point 169° C., available from KOEI CHEMICAL CO., LTD.) were put and mixed in a 1 L round bottom flask, and the mixture was heated with stirring at 80° C. for 1 hour. After completion of the stirring, the solvent toluene contained in the Au1T was removed by vacuum concentration.

The mixture from which the solvent was removed was transferred to a 2 L beaker and 600 g of a polar solvent, acetonitrile, was added thereto. The mixture was stirred at room temperature for 3 minutes and then allowed to stand. Fine gold particles precipitated at the bottom of the beaker when acetonitrile was added and the mixture was stirred and allowed to stand. On the other hand, unnecessary organic components contained in the mixture were dissolved in the supernatant, giving a brown acetonitrile solution. After removing the supernatant layer, 500 g of acetonitrile was again added to the precipitate, and the mixture was stirred and allowed to stand. After the fine gold particles precipitated, the acetonitrile supernatant layer was removed. While observing the coloring state of the supernatant acetonitrile layer, 400 g of acetonitrile was further added to the precipitate, and the same procedure was repeated. Subsequently, 300 g of acetonitrile was added to the precipitate, and when the mixture was stirred and allowed to stand, coloring was no longer found in the visual observation of the supernatant acetonitrile layer.

After removing the supernatant acetonitrile layer, the acetonitrile solution remaining in the fine gold particles precipitated at the bottom of the beaker was volatilized, and when the precipitate was dried, blackish brown fine powder was obtained. In this dry powder, the above amine compound remains on the gold fine particle surface in the form of a covering layer which is a sort of a single molecular layer, while the excess amine compound was removed by washing using acetonitrile. The dry powder contained 90% by mass of fine gold particles and 10% by mass in total of the amine compound as the surface covering layer.

In other words, the obtained dry powder is fine particles of gold (density: 19.300 g/cm$^3$) whose surface is covered with 2-ethylhexylamine (density: 0.789 g/cm$^3$), which are fine gold particles having an average particle size of 5 nm, on the surface of which a 2-ethylhexylamine covering layer having an average thickness of 2.7 nm is formed.

Example 3

Fine copper oxide particles in the form of a dry powder were prepared from a dispersion of fine copper particles in the form of fine copper oxide particles by the following procedure.

As a raw material for fine copper particles, commercially available ultrafine copper particle dispersion (product name: Independently Dispersed Ultrafine Particles Cu1T available from Vacuum Metallurgical Co., Ltd.), specifically, a dispersion of fine copper particles having an average particle size of 5 nm containing 30 parts by mass of ultrafine copper particles, 7 parts by mass of dodecylamine (molecular weight 185.36, boiling point 248° C.) as alkylamine and 63 parts by mass of toluene as an organic solvent was used. The fine copper particles are in the form of fine copper oxide particles having an oxide film on the surface.

1000 g of the ultrafine copper particle dispersion Cu1T (containing 30 wt % of Cu) and 150.0 g (50 wt % based on solid content of Cu) of 2-ethylhexylamine (boiling point 169° C., available from KOEI CHEMICAL CO., LTD.) were put and mixed in a 1 L round bottom flask, and the mixture was heated with stirring at 80° C. for 1 hour. After completion of the stirring, the solvent toluene contained in the Cu1T was removed by vacuum concentration.

The mixture from which the solvent was removed was transferred to a 2 L beaker and 1,000 g of a polar solvent, methanol, was added thereto. The mixture was stirred at room temperature for 3 minutes and then allowed to stand. In the above process, fine copper oxide particles precipitated at the bottom of the beaker when methanol was added and the mixture was stirred and allowed to stand. On the other hand, unnecessary organic components contained in the mixture were dissolved in the supernatant, giving a brown methanol solution. After removing the supernatant layer, 800 g of methanol was again added to the precipitate, and the mixture was stirred and allowed to stand. After the fine copper oxide particles precipitated, the methanol supernatant layer was removed. While observing the coloring state of the supernatant methanol layer, 500 g of methanol was further added to the precipitate, and the same procedure was repeated. Subsequently, 300 g of methanol was added to the precipitate obtained in the previous step, and when the mixture was stirred and allowed to stand, coloring was no longer found in the visual observation of the supernatant methanol layer. After removing the supernatant methanol layer, the methanol solution remaining in the fine copper oxide particles precipitated at the bottom of the beaker was volatilized and when the precipitate was dried, black fine powder was obtained. This dry powder contained 81% by mass of fine copper oxide particles. The above amine compound remained on the fine particle surface in the form of a covering layer which is a sort of a single molecular layer. The total of the remaining amine compound is 19% by mass based on the entire dry powder.

In other words, the obtained dry powder is fine particles of copper oxide (density: 6.315 g/cm$^3$) whose surface is covered with 2-ethylhexylamine (density: 0.789 g/cm$^3$), which are fine copper oxide particles having an average particle size of 5 nm, on the surface of which a 2-ethylhexylamine covering layer having an average thickness of 2.1 nm is formed.

Example 4

Fine silver particles in the form of a dry powder were prepared from a fine silver particle dispersion by the following procedure.

As a raw material for fine silver particles, a commercially available ultrafine silver particle dispersion (product name: Independently Dispersed Ultrafine Particle Ag1T available from Vacuum Metallurgical Co., Ltd.), specifically, a dispersion of fine silver particles having an average particle size of 3 nm containing 35 parts by mass of ultrafine silver particles, 7 parts by mass of dodecylamine (molecular weight 185.36, boiling point 248° C.) as alkylamine and 58 parts by mass of toluene as an organic solvent was used.

500 g of the ultrafine silver particle dispersion Ag1T (containing 35 wt % of Ag) and 350 g (200 wt % based on solid content of Ag) of myristic acid (boiling point 248.7° C. (100 mmHg), molecular weight 228.38) were put and mixed in a 1 L round bottom flask, and the mixture was heated with stirring at 80° C. for 1 hour. After completion of the stirring, the solvent toluene contained in the Ag1T was removed by vacuum concentration.

The mixture from which the solvent was removed was transferred to a 2 L beaker and 1,000 g of a polar solvent, acetone, was added thereto. The mixture was stirred at room temperature for 3 minutes and then allowed to stand. In the above process, fine silver particles precipitated at the bottom of the beaker when acetone was added and the mixture was stirred and allowed to stand. On the other hand, unnecessary organic components contained in the mixture were dissolved in the supernatant, giving a brown acetone solution. After removing the supernatant layer, 800 g of acetone was again added to the precipitate, and the mixture was stirred and allowed to stand. After the fine silver particles precipitated, the acetone supernatant layer was removed. While observing the coloring state of the supernatant acetone layer, 500 g of acetone was further added to the precipitate, and the same procedure was repeated. Subsequently, 300 g of acetone was added to the precipitate, and when the mixture was stirred and allowed to stand, coloring was no longer found in the visual observation of the supernatant acetone layer. After removing the supernatant acetone layer, the acetone solution remaining in the fine silver particles precipitated at the bottom of the beaker was volatilized and when the precipitate was dried, blue fine powder was obtained. In this dry powder, the above myristic acid remained on the fine silver particle surface in the form of a covering layer which is a sort of a single molecular layer, while the amine compound derived from the original coating layer molecules and the excess myristic acid were removed by washing using acetone. The dry powder contained 84% by mass of fine silver particles and 16% by mass of myristic acid as the surface covering layer.

Comparative Example 1

A fine silver particle mixture in the form of slurry equivalent to the mixture in Example 1 from which the solvent toluene was removed was prepared.

As a fine silver particle raw material, an ultrafine silver particle dispersion having the same composition as in Example 1 (product name: Independently Dispersed Ultrafine Particles Ag1T available from Vacuum Metallurgical Co., Ltd.) was used.

500 g of the ultrafine silver particle dispersion Ag1T (containing 35 wt % of Ag) and 87.5 g (50 wt % based on solid content of Ag) of dibutylaminopropylamine (boiling point 238° C. available from KOEI CHEMICAL CO., LTD.) were put and mixed in a 1 L round bottom flask, and the mixture was heated with stirring at 80° C. for 1 hour. After completion of the stirring, the solvent toluene contained in the Ag1T was removed by vacuum concentration.

At this stage, the mixture was a bluish brown slurry in which the added dibutylaminopropylamine and dodecylamine remained. This mixture in the form of slurry contained 59% by mass of fine silver particles and 41% by mass in total of the aforementioned amine compounds.

Example 5

Toner particles containing fine silver particles in the form of a dry powder were prepared by the following procedure.

2.0 g of a styrene-acrylic resin for printer toner was mixed with 100 g each of the fine silver particles in the form of a dry powder prepared under the conditions of Example 1 to prepare toner particles having an average particle size of 1 μm, which contains the fine silver particles as core particles and in which the core particles are enclosed in the styrene-acrylic resin constituting a binder resin layer. The aforementioned styrene-acrylic resin used as a binder resin for toner has a softening point of 135° C.

Using an electrophotographic copying machine, the toner particles were transferred to the surface of a film-shaped polyimide substrate to form a toner image of a desired circuit pattern. In the electrophotographic drawing, a photoconductor drum is charged to a negative polarity so as to match with the circuit pattern to be drawn, and by performing a negative or positive exposure on the photoconductor drum surface, an electrostatic latent image corresponding to the circuit pattern is formed. Thereafter, the toner particles are electrostatically attached to the electrostatic latent image and the latent image is developed to form a toner image. In the transferring step, a system for transferring a toner image to the surface of the film-shaped polyimide substrate by static elimination is employed. After transferring the toner particles to the film-shaped polyimide substrate surface, to perform a fixation process, toner particles were press-bonded by heating under the conditions of a linear pressure of a roller of 5 kgf/cm and a temperature of 180° C. The transferred/fixed toner image had an average toner layer thickness of 10 μm.

By performing a heating process for the toner image fixed to the film-shaped polyimide substrate surface with the binder resin layer at 250° C. for 1 hour, the fine silver particles contained in the toner particles were baked to form a silver conductor layer, giving a conductor circuit pattern having an average film thickness of 10 μm. The silver conductor layer had a volume resistivity of 10.1 μΩ·cm.

Example 6

Toner particles containing fine copper oxide particles in the form of a dry powder were prepared by the following procedure.

1.2 g of a styrene-acrylic resin for printer toner was mixed with 100 g each of the fine copper oxide particles in the form of a dry powder prepared under the conditions of Example 3 to prepare toner particles having an average particle size of 1 μm, which contains the fine copper oxide particles as core particles and in which the core particles are enclosed in the styrene-acrylic resin constituting a binder resin layer. The aforementioned styrene-acrylic resin used as a binder resin for toner has a softening point of 135° C.

Using an electrophotographic copying machine, the toner particles were transferred to the surface of a film-shaped polyimide substrate to form a toner image of a desired circuit pattern. In the electrophotographic drawing, a photoconductor drum is charged to a negative polarity so as to match with the circuit pattern to be drawn, and by performing a negative or positive exposure on the photoconductor drum surface, an electrostatic latent image corresponding to the circuit pattern is formed. Thereafter, the toner particles are electrostatically attached to the electrostatic latent image and the latent image is developed to form a toner image. In the transferring step, a system for transferring a toner image to the surface of the film-shaped polyimide substrate by static elimination is employed. After transferring the toner particles to the film-shaped polyimide substrate surface, to perform a fixation process, toner particles were press-bonded by heating under the conditions of a linear pressure of a roller of 5 kgf/cm and a temperature of 180° C. The transferred/fixed toner image had an average toner layer thickness of 10 μm.

In the first process, the toner image fixed to the film-shaped polyimide substrate surface with the binder resin layer was placed face up at a pre-determined position on a hot plate pre-heated to 300° C. disposed in the gastight chamber illustrated in FIG. 1. A mixed gas of glycerol vapor and nitrogen (glycerol vapor:nitrogen mixing ratio=20% by volume:80% by volume) was introduced into the gastight chamber through an inlet for gas 5, and with spraying the gas to the surface of the coated layer of the toner particles, heating was performed at 300° C. for 5 minutes in an atmosphere containing glycerol vapor having reducing ability (partial pressure of glycerol vapor: 200 hPa). With this heating process (first process) in a reducing atmosphere, the surface oxidation film of the fine copper oxide particles contained in the toner particles is reduced to give fine copper particles. The glycerol vapor/nitrogen mixed gas is introduced after diluting glycerol vapor at its equilibrium vapor pressure heated to 300° C. with nitrogen carrier gas to the aforementioned composition.

Then, with continuing heating at 300° C., the second process of repeating an oxidation/re-reduction cycle for five times comprising oxidizing the metal surface by spraying dry air (oxygen molecule:nitrogen molecule mixing ratio=20% by volume:80% by volume) to the surface for 10 seconds and re-reducing the metal surface by spraying the aforementioned glycerol vapor/nitrogen mixed gas to the surface instead of the dry air and maintaining the substrate in the atmosphere containing glycerol vapor having reducing ability for 2 minutes and 50 seconds was performed. After continuously performing the aforementioned first and second processes, with spraying the glycerol vapor/nitrogen mixed gas to the surface, the substrate was allowed to stand and cooled to room temperature. Moisture was beforehand removed from the aforementioned dry air.

Through the above series of processes, fine copper particles were reproduced by the reduction of the fine copper oxide particles and baked to form a copper conductor layer, giving a conductor circuit pattern having an average film thickness of 8 μm. The copper conductor layer had a volume resistivity of 13.2 μΩ·cm.

Example 6-1

The toner image obtained by transferring and fixing the toner particles containing fine copper oxide particles in the form of a dry powder prepared under the conditions described in Example 6 was subjected to reduction and the fine copper particles were baked to prepare a copper conductor layer by the following procedure.

The toner image fixed to the film-shaped polyimide substrate surface with the binder resin layer was placed face up at a pre-determined position on a hot plate pre-heated to 300° C. disposed in the gastight chamber illustrated in FIG. 1. A mixed gas of glycerol vapor and nitrogen (glycerol vapor: nitrogen mixing ratio=20% by volume: 80% by volume) was introduced into the gastight chamber through an inlet for gas 5, and with spraying the gas to the surface of the coated layer of the toner particles, heating was performed at 300° C. for 15 minutes in an atmosphere containing glycerol vapor having reducing ability (partial pressure of glycerol vapor: 200 hPa). During this heating process in a reducing atmosphere, the surface oxidation film of the fine copper oxide particles contained in the toner particles is reduced to give fine copper particles, upon which sintering of the fine copper particles proceeds. After the 15-minute heating process, the substrate is allowed to cool to room temperature while continuing spraying of the glycerol vapor/nitrogen mixed gas.

The glycerol vapor/nitrogen mixed gas is introduced after diluting glycerol vapor at its equilibrium vapor pressure heated to 300° C. with nitrogen carrier gas to the aforementioned composition.

Through the above series of processes, fine copper particles were reproduced by the reduction of the fine copper oxide particles and baked to form a copper conductor layer, giving a conductor circuit pattern having an average film thickness of 8 μm. The copper conductor layer had a volume resistivity of 15.0 μΩ·cm.

The volume resistivity of the copper conductor layer attained by the technique of Example 6-1 is comparable to that attained by the technique of Example 6 in which a copper conductor layer is formed while repeating the oxidation/re-reduction cycle after reduction.

Example 7

Toner particles containing fine copper oxide particles in the form of a dry powder and copper powder were prepared by the following procedure.

1.6 g of a styrene-acrylic resin for printer toner was mixed with a mixed powder of 30 g of the fine copper oxide particles in the form of a dry powder prepared under the conditions of Example 3 and 70 g of atomized copper powder 1100Y (average particle size 0.9 μm) available from MITSUI MINING AND SMELTING CO. LTD. to prepare toner particles having an average particle size of 6 μm, which contains the copper powder and the fine copper oxide particles as core particles and in which the core particles are enclosed in the styrene-acrylic resin constituting a binder resin layer. The aforementioned styrene-acrylic resin used as a binder resin for toner has a softening point of 135° C.

Using an electrophotographic copying machine, the toner particles were transferred to the surface of a film-shaped polyimide substrate to form a toner image of a desired circuit pattern. In the electrophotographic drawing, a photoconductor drum is charged to a negative polarity so as to match with the circuit pattern to be drawn, and by performing a negative or positive exposure on the photoconductor drum surface, an electrostatic latent image corresponding to the circuit pattern is formed. Thereafter, the toner particles are electrostatically attached to the electrostatic latent image and the latent image is developed to form a toner image. In the transferring step, a system for transferring a toner image to the surface of the film-shaped polyimide substrate by static elimination is employed. After transferring the toner particles to the film-shaped polyimide substrate surface, to perform a fixation process, toner particles were press-bonded by heating under the conditions of a linear pressure of a roller of 5 kgf/cm and a temperature of 180° C. The transferred/fixed toner image had an average toner layer thickness of 15 μm.

In the first process, the toner image fixed to the film-shaped polyimide substrate surface with the binder resin layer was placed face up at a pre-determined position on a hot plate pre-heated to 300° C. disposed in the gastight chamber illustrated in FIG. 1. A mixed gas of glycerol vapor and nitrogen (glycerol vapor:nitrogen mixing ratio=20% by volume:80% by volume) was introduced into the gastight chamber through an inlet for gas 5, and with spraying the gas to the surface of the coated layer of the toner particles, heating was performed at 300° C. for 5 minutes in an atmosphere containing glycerol vapor having reducing ability (partial pressure of glycerol vapor: 200 hPa). With this heating process (first process) in a reducing atmosphere, the surface oxidation film of the fine copper oxide particles contained in the toner particles is reduced to give fine copper particles. The glycerol vapor/nitrogen mixed gas is introduced after diluting glycerol vapor at its equilibrium vapor pressure heated to 300° C. with nitrogen carrier gas to the aforementioned composition.

Then, with continuing heating at 300° C., the second process of repeating an oxidation/re-reduction cycle for five times comprising oxidizing the metal surface by spraying dry air (oxygen molecule:nitrogen molecule mixing ratio=20% by volume:80% by volume) to the surface for 10 seconds and re-reducing the metal surface by spraying the aforementioned glycerol vapor/nitrogen mixed gas to the surface instead of the dry air and maintaining the substrate in the atmosphere containing glycerol vapor having reducing ability for 2 minutes and 50 seconds was performed. After continuously performing the aforementioned first and second processes, with spraying the glycerol vapor/nitrogen mixed gas to the surface, the substrate was allowed to stand and cooled to room temperature. Moisture was beforehand removed from the aforementioned dry air.

Through the above series of processes, fine copper particles were reproduced by the reduction of the fine copper oxide particles and the copper powder added and the fine copper particles were baked to form a copper conductor layer in which the copper powder and the fine copper particles are entirely integrated, giving a conductor circuit pattern having an average film thickness of 15 μm. The copper conductor layer had a volume resistivity of 15.8 μΩ·cm.

Example 8

Using an electrophotographic copying machine, the fine silver particles in the form of dry powder having an average particle size of 3 nm prepared under the conditions in Example 1 were used as toner particles and directly transferred to the surface of a film-shaped polyimide substrate to form a toner image of a desired circuit pattern. In the electrophotographic drawing, a photoconductor drum is charged to a negative polarity so as to match with the circuit pattern to be drawn, and by performing a negative or positive exposure on the photoconductor drum surface, an electrostatic latent image corresponding to the circuit pattern is formed. Thereafter, the toner particles are electrostatically attached to the electrostatic latent image and the latent image is developed to form a toner image. In the transferring step, a system for transferring a toner image to the surface of the film-shaped polyimide substrate by static elimination is employed. After transferring the toner particles to the film-shaped polyimide substrate surface, to perform a fixation process, toner particles were press-bonded by heating under the conditions of a linear pressure of a roller of 5 kgf/cm and a temperature of 180° C. The transferred/fixed toner image had an average toner layer thickness of 10 μm.

By performing a heating process for the toner image fixed to the film-shaped polyimide substrate surface at 250° C. for 1 hour, the fine silver particles contained in the fixed toner layer were baked and a silver conductor layer was formed, giving a conductor circuit pattern having an average film thickness of 10 μm. The silver conductor layer had a volume resistivity of 3.7 μΩ·cm.

Example 9

Using an electrophotographic copying machine, the copper oxide particles in the form of dry powder having an average particle size of 5 nm prepared under the conditions in Example 3 were used as toner particles and directly transferred to the surface of a film-shaped polyimide substrate to form a toner image of a desired circuit pattern. In the electrophotographic drawing, a photoconductor drum is charged to a negative polarity so as to match with the circuit pattern to be drawn, and by performing a negative or positive exposure on the photoconductor drum surface, an electrostatic latent image corresponding to the circuit pattern is formed. Thereafter, the toner particles are electrostatically attached to the electrostatic latent image and the latent image is developed to form a toner image. In the transferring step, a system for transferring a toner image to the surface of the film-shaped polyimide substrate by static elimination is employed. After transferring the toner particles to the film-shaped polyimide substrate surface, to perform a fixation process, toner particles were press-bonded by heating under the conditions of a linear pressure of a roller of 5 kgf/cm and a temperature of 180° C. The transferred/fixed toner image had an average toner layer thickness of 10 μm.

In the first process, the toner image composed of fine copper oxide particles in the form of dry powder fixed to the film-shaped polyimide substrate surface was placed face up at a pre-determined position on a hot plate pre-heated to 300° C. disposed in the gastight chamber illustrated in FIG. 1. A mixed gas of glycerol vapor and nitrogen (glycerol vapor:nitrogen mixing ratio=20% by volume: 80% by volume) was introduced into the gastight chamber through an inlet for gas 5, and with spraying the gas to the surface of the coated layer, heating was performed at 300° C. for 5 minutes in an atmosphere containing glycerol vapor having reducing ability (partial pressure of glycerol vapor: 200 hPa). With this heating process (first process) in a reducing atmosphere, the surface oxidation film of the fine copper oxide particles contained in the coated layer is reduced to give fine copper particles. The glycerol vapor/nitrogen mixed gas is introduced after diluting glycerol vapor at its equilibrium vapor pressure heated to 300° C. with nitrogen carrier gas to the aforementioned composition.

Then, with continuing heating at 300° C., the second process of repeating an oxidation/re-reduction cycle for five times comprising oxidizing the metal surface by spraying dry air (oxygen molecule:nitrogen molecule mixing ratio=20% by volume:80% by volume) to the surface for 10 seconds and re-reducing the metal surface by spraying the aforementioned glycerol vapor/nitrogen mixed gas to the surface instead of the dry air and maintaining the substrate in the atmosphere containing glycerol vapor having reducing ability for 2 minutes and 50 seconds was performed. After continuously performing the aforementioned first and second processes, with spraying the glycerol vapor/nitrogen mixed gas to the surface, the substrate was allowed to stand and cooled to room temperature. Moisture was beforehand removed from the aforementioned dry air.

Through the above series of processes, fine copper particles were reproduced by the reduction of the fine copper oxide particles, the reproduced fine copper particles were baked and a copper conductor layer composed entirely of a sintered product of the fine copper particles was formed, giving a conductor circuit pattern having an average film thickness of 8 µm. The copper conductor layer had a volume resistivity of 6.9 µΩ·cm.

Example 10

Toner particles containing fine silver particles in the form of a dry powder in which myristic acid was used as coating layer molecules were prepared by the following procedure.

10 g of a styrene-acrylic resin for printer toner was mixed with 100 g each of the fine silver particles in the form of a dry powder prepared under the conditions of Example 4 to prepare toner particles having an average particle size of 4 µm, which contains the fine silver particles as core particles and in which the core particles are enclosed in the styrene-acrylic resin constituting a binder resin layer. The aforementioned styrene-acrylic resin used as a binder resin for toner has a softening point of 135° C.

Using an electrophotographic copying machine, the toner particles were transferred to the surface of a film-shaped polyimide substrate to form a toner image of a desired circuit pattern. In the electrophotographic drawing, a photoconductor drum is charged to a negative polarity so as to match with the circuit pattern to be drawn, and by performing a negative or positive exposure on the photoconductor drum surface, an electrostatic latent image corresponding to the circuit pattern is formed. Thereafter, the toner particles are electrostatically attached to the electrostatic latent image and the latent image is developed to form a toner image. In the transferring step, a system for transferring a toner image to the surface of the film-shaped polyimide substrate by static elimination is employed. After transferring the toner particles to the film-shaped polyimide substrate surface, to perform a fixation process, toner particles were press-bonded by heating under the conditions of a linear pressure of a roller of 5 kgf/cm and a temperature of 180° C. The transferred/fixed toner image had an average toner layer thickness of 10 µm.

By performing a heating process for the toner image fixed to the film-shaped polyimide substrate surface with the binder resin layer at 250° C. for 1 hour, the fine silver particles contained in the toner particles were baked and a silver conductor layer was formed, giving a conductor circuit pattern having an average film thickness of 10 µm. The silver conductor layer had a volume resistivity of 14.4 µΩ·cm.

Example 11

A fine silver particle dispersion having a liquid viscosity appropriate for screen printing was prepared by the following procedure, using fine silver particles in the form of a dry powder as a raw material.

In the fine silver particles in the form of a dry powder prepared under the conditions of Example 1 used as a raw material, an amine compound containing a small amount of a secondary component, dodecylamine, in addition to the main component dibutylaminopropylamine is present as a surface covering layer for the fine silver particles having an average particle size of 3 nm. In Example 11, since a dispersion in which the fine silver particles in the form of a dry powder are uniformly dispersed in a dispersion solvent 1-decanol is prepared with the covering layer being present on the surface, a re-dispersing process described below is employed.

To 213.4 g of the fine silver particles in the form of a dry powder prepared under the condition of Example 1 were added 11.6 g of Kalcol 1098 (1-decanol, melting point 6.88° C., boiling point 232° C., available from KAO CORPORATION) and 300 g of hexane, and the mixture is heated with stirring at 70° C. for 30 minutes. By this heating with stirring, Ag nanoparticles in the form of blue fine powder are re-dispersed in a mixed solvent of Kalcol and hexane, forming a uniform dispersion. After completion of the stirring, the resultant is filtrated through a 0.2 µm membrane filter, and hexane in the filtrate is removed by vacuum concentration. Upon removal of the low boiling point solvent hexane contained in the mixed solvent of Kalcol and hexane, an entirely uniform dark blue silver nanoparticle dispersion in the form of paste in which the fine silver particles having a surface covering layer are uniformly dispersed in the remaining high boiling point solvent Kalcol is obtained.

The paste-dispersion (nanoparticle paste) had a liquid viscosity of 150 Pa·s (spiral viscometer, measurement temperature: 25° C.). The liquid viscosity satisfies the liquid viscosity condition of 50 to 200 Pa·s (25° C.) appropriate for screen printing. Referring to the entire composition of the silver nanoparticle paste, 50 parts by mass in total of organic components, i.e., 11.6 parts by mass of 1-decanol which is the main dispersion solvent and 38.4 parts by mass of other organic substances (dibutylaminopropylamine, etc.) remained based on 175 parts by mass of the Ag nanoparticles which constitute a conductive medium. Accordingly, in this silver nanoparticle paste, the Ag nanoparticles which are the solid component have a volume ratio of 21.6% by volume and the organic components have a volume ratio of 78.4% by volume, the dispersion solvent amounting to 18.1% by volume thereof.

In other words, the obtained paste-dispersion is a dispersion of fine silver particles having an average particle size of 3 nm, on the surface of which a dibutylaminopropylamine covering layer having an average thickness of 1.7 nm is formed, which are dispersed in a dispersion solvent Kalcol 1098 (1-decanol, density: 0.830 g/cm$^3$) at a high density.

A 10×50 mm wide pattern was printed on a slide glass using the obtained silver nanoparticle paste with a #500 mesh stainless steel screen printing plate at an average film thickness upon coating of 10 µm by a screen printing method. After printing, a heating process was performed for the silver nanoparticle paste coating layer on the slide glass at 250° C. for 40 minutes to bake the silver nanoparticles contained in the layer, whereby a conductor layer pattern composed of a sintered product layer of the silver nanoparticles was formed. The surface of the conductor layer pattern was glossy like a mirror surface, and the layer had an average film thickness of 3 µm.

The volume resistivity of the uniform conductor layer having the aforementioned average film thickness was measured to be 2.8 µΩ·cm. The resistivity of silver in bulk is 1.59 µΩ·cm (20° C.), and so the volume resistivity of the obtained sintered product layer of the silver nanoparticles was comparable to the resistivity of silver in bulk.

Example 12

A fine silver particle dispersion having a liquid viscosity appropriate for inkjet printing was prepared by the following procedure, using fine silver particles in the form of a dry powder as a raw material.

In the fine silver particles in the form of a dry powder prepared under the conditions of Example 1 used as a raw material, an amine compound containing a small amount of a secondary component, dodecylamine, in addition to the main component dibutylaminopropylamine is present as a surface covering layer for the fine silver particles having an average particle size of 3 nm. In Example 12, since a dispersion in which the fine silver particles in the form of a dry powder are uniformly dispersed in the main dispersion solvent tetradecane is prepared with the covering layer being present on the surface, a re-dispersing process described below is employed.

To 213.4 g of the fine silver particles in the form of a dry powder prepared under the condition of Example 1 were added 20.8 g of bis-2-ethylhexylamine (boiling point 263° C., available from Tokyo Chemical Industry, Co., Ltd.), 93.6 g of N14 (tetradecane, melting point 5.86° C., boiling point 253.57° C., available from JAPAN ENERGY CORPORATION) and 300 g of hexane, and the mixture was heated with stirring at 70° C. for 30 minutes. By this heating with stirring, Ag nanoparticles in the form of blue fine powder are re-dispersed in a mixed solvent of N14, hexane and bis-2-ethylhexylamine, forming a uniform dispersion. After completion of the stirring, the resultant is filtrated through a 0.2 μm membrane filter, and hexane in the filtrate is removed by vacuum concentration. Upon removal of the low boiling point solvent hexane contained in the mixed solvent, an entirely uniform dark blue silver nanoparticle dispersion in the form of high fluidity paste in which the fine silver particles having a surface covering layer are uniformly dispersed in a mixture of the remaining high boiling point solvents N14 and bis-2-ethylhexylamine is obtained.

The high fluidity paste-dispersion (silver nanoparticle ink) had a liquid viscosity of 10 mPa·s (B-type rotation viscometer, measurement temperature: 20° C.). The liquid viscosity satisfies the liquid viscosity condition of 5 to 30 mPa·s (25° C.) appropriate for inkjet printing. Referring to the entire composition of the silver nanoparticle dispersion, 152.8 parts by mass in total of organic components, i.e., 20.8 parts by mass of bis-2-ethylhexylamine, 93.6 parts by mass of tetradecane which is the main dispersion solvent and 38.4 parts by mass of other organic substances (dibutylaminopropylamine, etc.) remained based on 175 parts by mass of the Ag nanoparticles which constitute a conductive medium. Accordingly, in this silver nanoparticle ink, the Ag nanoparticles which are the solid component have a volume ratio of 7.9% by volume and the organic components have a volume ratio of 92.1% by volume, the main dispersion solvent amounting to 57.8% by volume thereof.

In other words, the obtained silver nanoparticle ink is a dispersion of fine silver particles having an average particle size of 3 nm, on the surface of which a dibutylaminopropylamine covering layer having an average thickness of 1.7 nm is formed, which are dispersed in a dispersion solvent of a mixture of N14 (tetradecane, density: 0.767 g/cm$^3$) and bis-2-ethylhexylamine (density: 0.805 g/cm$^3$) at a low density.

A 10×50 mm wide pattern was printed on a slide glass using the obtained silver nanoparticle ink by inkjet coating at an average film thickness upon coating of 20 μm by an inkjet printing method. After printing, a heating process was performed for the silver nanoparticle ink coating layer on the slide glass at 230° C. for 60 minutes to bake the silver nanoparticles contained in the layer, whereby a conductor layer pattern composed of a sintered product layer of the silver nanoparticles was formed. The surface of the conductor layer pattern was glossy like a mirror surface and the layer had an average film thickness of 3 μm. The volume resistivity of the uniform conductor layer having the aforementioned average film thickness was measured to be 3.0 μΩ·cm, which was comparable to the resistivity of silver in bulk.

Example 13

A fine gold particle dispersion having a liquid viscosity appropriate for screen printing was prepared by the following procedure, using fine gold particles in the form of a dry powder as a raw material.

In the fine gold particles in the form of a dry powder prepared under the conditions of Example 2 used as a raw material, an amine compound containing a small amount of a secondary component, dodecylamine, in addition to the main component 2-ethylhexylamine (density: 0.805 g/cm$^3$) is present as a surface covering layer for the fine gold particles having an average particle size of 5 nm. In Example 13, since a dispersion in which the fine gold particles in the form of a dry powder are uniformly dispersed in a mixture of dispersion solvents of AF-7 and bis-2-ethylhexylamine is prepared with the covering layer being present on the surface, a re-dispersing process described below is employed.

To 100.0 g of the fine gold particles in the form of a dry powder prepared under the condition of Example 2 were added 5.3 g of bis-2-ethylhexylamine (boiling point 263° C., available from Tokyo Chemical Industry, Co., Ltd.), 5.0 g of AF7 (boiling point 259 to 282° C., available from NIPPON OIL CORPORATION) and 300 g of toluene, and the mixture was heated with stirring at 70° C. for 30 minutes. By this heating with stirring, Au nanoparticles in the form of dark red fine powder are re-dispersed in a mixture of AF7 and bis-2-ethylhexylamine dissolved in toluene, forming a uniform dispersion. After completion of the stirring, the resultant is filtrated through a 0.2 μm membrane filter, and the solvent toluene in the filtrate is removed by vacuum concentration. Upon removal of the low boiling point solvent toluene contained in the mixture, an entirely uniform dark red gold nanoparticle dispersion in the form of paste in which the fine gold particles having a surface covering layer are uniformly dispersed in the remaining high boiling point solvents AF7 and bis-2-ethylhexylamine is obtained.

The paste-dispersion (gold nanoparticle paste) had a liquid viscosity of 128 Pa·s (spiral viscometer, measurement temperature: 23° C.). The liquid viscosity satisfies the liquid viscosity condition of 50 to 200 Pa·s (25° C.) appropriate for screen printing. Referring to the entire composition of the gold nanoparticle paste, 26.6 parts by mass in total of organic components, i.e., 10.0 parts by mass of 2-ethylhexylamine, 10.6 parts by mass of bis-2-ethylhexylamine and 6.0 parts by mass of AF7 which is the main dispersion solvent remained based on 90 parts by mass of the Au nanoparticles which constitute a conductive medium. Accordingly, in this gold nanoparticle paste, the Au nanoparticles which are the solid component have a volume ratio of 12.4% by volume and the organic components have a volume ratio of 87.6% by volume, the main dispersion solvent AF7 amounting to 19.1% by volume thereof.

In other words, the obtained gold nanoparticle paste is a dispersion of fine gold particles having an average particle size of 5 nm, on the surface which a 2-ethylhexylamine covering layer having an average thickness of 2.7 nm is formed, which are dispersed in a dispersion solvent (total: 54.0% by volume) of a mixture of AF7 (density: 0.834 g/cm$^3$) and bis-2-ethylhexylamine (density: 0.805 g/cm$^3$).

A 10×50 mm wide pattern was printed on a slide glass using the obtained gold nanoparticle paste with a #500 mesh stainless steel screen printing plate at an average film thickness upon coating of 10 μm by a screen printing method. After printing, a heating process was performed for the gold nanoparticle paste coating layer on the slide glass at 250° C. for 60 minutes to bake the gold nanoparticles contained in the layer, whereby a conductor layer pattern composed of a sintered product layer of the gold nanoparticles was formed. The surface of the conductor layer pattern was glossy like a mirror surface and the layer had an average film thickness of 2 µm. The volume resistivity of the uniform conductor layer having the aforementioned average film thickness was measured to be 8.7 µΩ·cm. The resistivity of gold in bulk is 2.35 µΩ·cm (20° C.), and so the volume resistivity of the obtained sintered product layer of the gold nanoparticles was comparable to the resistivity of the gold in bulk.

Example 14

A fine gold particle dispersion having a liquid viscosity appropriate for inkjet printing was prepared by the following procedure, using fine gold particles in the form of a dry powder as a raw material.

In the fine gold particles in the form of a dry powder prepared under the conditions of Example 2 used as a raw material, an amine compound containing a small amount of a secondary component, dodecylamine, in addition to the main component 2-ethylhexylamine is present as a surface covering layer for the fine gold particles having an average particle size of 5 nm. In Example 14, since a dispersion in which the fine gold particles in the form of a dry powder are uniformly dispersed in a mixture of dispersion solvents of AF7 and bis-2-ethylhexylamine is prepared with the covering layer being present on the surface, a re-dispersing process described below is employed.

To 100.0 g of the fine gold particles in the form of a dry powder prepared under the condition of Example 2 were added 10.4 g of 2-ethylhexylamine (boiling point 169° C., available from KOEI CHEMICAL CO., LTD.), 13.6 g of bis-2-ethylhexylamine (boiling point 263° C., available from Tokyo Chemical Industry, Co., Ltd.), 5.9 g of AF7 (boiling point 259 to 282° C. available from NIPPON OIL CORPORATION) and 300 g of toluene, and the mixture was heated with stirring at 70° C. for 30 minutes. By this heating with stirring, Au nanoparticles in the form of dark red fine powder are re-dispersed in a mixture of AF7, bis-2-ethylhexylamine and 2-ethylhexylamine added to toluene, forming a uniform dispersion. After completion of the stirring, the resultant is filtrated through a 0.2 µm membrane filter, and the solvent toluene in the filtrate is removed by vacuum concentration. Upon removal of the low boiling point solvent toluene contained in the mixture, an entirely uniform dark red gold nanoparticle dispersion in the form of high fluidity paste in which the fine gold particles having a surface covering layer are uniformly dispersed in a mixture of the remaining high boiling point solvents AF7, bis-2-ethylhexylamine and 2-ethylhexylamine is obtained.

The high fluidity paste-dispersion (gold nanoparticle ink) had a liquid viscosity of 7 mPa·s (B-type rotation viscometer, measurement temperature: 20° C.). The liquid viscosity satisfies the liquid viscosity condition of 5 to 30 mPa·s (25° C.) appropriate for inkjet printing. Referring to the entire composition of the gold nanoparticle dispersion, 89.9 parts by mass in total of organic components, i.e., 20.4 parts by mass of 2-ethylhexylamine, 13.6 parts by mass of bis-2-ethylhexylamine and 55.9 parts by mass of AF7 which is the main dispersion solvent remained based on 90 parts by mass of the Au nanoparticles which constitute a conductive medium. Accordingly, in this gold nanoparticle ink, the Au nanoparticles which are the solid component have a volume ratio of 4.1% by volume and the organic components have a volume ratio of 95.9% by volume, the main dispersion solvent AF7 amounting to 58.6% by volume thereof.

In other words, the obtained gold nanoparticle ink is a dispersion of fine gold particles having an average particle size of 5 nm, on the surface of which a 2-ethylhexylamine covering layer having an average thickness of 2.7 nm is formed, which are dispersed in a dispersion solvent (total: 84.8% by volume) of a mixture obtained by beforehand dissolving 2-ethylhexylamine (density: 0.789 g/cm³) in a mixed solvent of AF7 (density: 0.834 g/cm³) and bis-2-ethylhexylamine (density: 0.805 g/cm³) at a low density. Accordingly, since an appropriate amount of 2-ethylhexylamine, which is a constituent of the covering layer, is beforehand dissolved in the dispersion solvent, an effect of preventing dissolution of 2-ethylhexylamine constituting the covering layer can be obtained.

A 10×50 mm wide pattern was printed on a slide glass using the obtained gold nanoparticle ink by ink jet coating at an average film thickness upon coating of 20 µm by an ink jet printing method. After printing, a heating process was performed for the gold nanoparticle ink coating layer on the slide glass at 250° C. for 60 minutes to bake the gold nanoparticles, whereby a conductor layer pattern composed of a sintered product layer of the gold nanoparticles was formed. The surface of the conductor layer pattern was glossy like a mirror surface and the layer had an average film thickness of 2 µm. The volume resistivity of the entire conductor layer having the aforementioned average film thickness was measured to be 6.6 µΩ·cm, which was comparable to the resistivity of the gold in bulk.

Example 15

A copper oxide fine particle dispersion having a liquid viscosity appropriate for screen printing was prepared by the following procedure, using fine copper oxide particles in the form of a dry powder as a raw material.

In the fine copper oxide particles in the form of a dry powder prepared under the conditions of Example 3 used as a raw material, an amine compound containing a small amount of a secondary component, dodecylamine, in addition to the main component 2-ethylhexylamine remains as a surface covering layer for the fine copper particles having an average particle size of 5 nm and having an oxide film on the surface. In Example 15, since a dispersion in which fine copper oxide particles in the form of a dry powder are uniformly dispersed in a mixture of dispersion solvents of Kalcol and bis-2-ethylhexylamine is prepared with the covering layer of the amine compound being present on the surface, a re-dispersing process described below is employed.

To 370 g of the fine copper oxide particles in the form of a dry powder prepared under the condition of Example 3 were added 7.0 g of bis-2-ethylhexylamine (boiling point 263° C., available from Tokyo Chemical Industry, Co., Ltd.), 14.8 g of Kalcol 1098 (1-decanol, melting point 6.88° C., boiling point 232° C., available from KAO CORPORATION) and 300 g of hexane, and the mixture was heated with stirring at 70° C. for 30 minutes. By this heating with stirring, copper oxide nanoparticles in the form of black fine powder are re-dispersed in a mixture containing Kalcol and bis-2-ethylhexylamine in hexane, forming a uniform dispersion. After completion of the stirring, the resultant is filtrated through a 0.2 µm membrane filter, and hexane in the filtrate is removed by vacuum concentration. Upon removal of the solvent hexane, a uniform greenish black nanoparticle dispersion in the form of paste was obtained. The paste-dispersion (nanoparticle paste)

had a liquid viscosity of 100 Pa·s (spiral viscometer, measurement temperature: 23° C.). Referring to the entire composition of the nanoparticle paste, 91.8 parts by mass in total of organic components, i.e., 14.8 parts by mass of 1-decanol which is the main dispersion solvent, 70.0 parts by mass of 2-ethylhexylamine and 7.0 parts by mass of bis-2-ethylhexylamine remained based on 300 parts by mass of the copper oxide nanoparticles which constitute a conductive medium. Accordingly, in this nanoparticle paste, the copper oxide nanoparticles which are the solid component have a volume ratio of 29.2% by volume and the organic components have a volume ratio of 70.8% by volume, the dispersion solvent amounting to 10.9% by volume thereof.

In other words, the obtained paste-dispersion is a dispersion of fine copper particles having an average particle size of 5 nm and having an oxide film on the surface, on the surface of which a 2-ethylhexylamine covering layer having an average thickness of 2.1 nm is formed, which are dispersed in a dispersion solvent (total: 16.2% by volume) of a mixture of N14 (tetradecane, density: 0.767 g/cm$^3$) and bis-2-ethylhexylamine (density: 0.805 g/cm$^3$) at a high density.

A 10×50 mm wide pattern was printed on a slide glass using the obtained copper oxide nanoparticle paste with a #500 mesh stainless steel screen printing plate at an average film thickness upon coating of 10 μm by a screen printing method. After printing, by subjecting the nanoparticle paste coating layer on the slide glass to the following process, the dispersion solvent contained in the fine copper oxide particle dispersion coating layer is evaporated and the surface of the fine copper oxide particles contained in the coating layer is reduced to convert to the corresponding copper particles, and the fine copper particles reproduced by the reduction are baked, whereby a conductor layer pattern composed of a sintered product layer of the copper nanoparticles is formed.

In the first process, the nanoparticle paste coating layer on the slide glass is placed face up at a pre-determined position on a hot plate pre-heated to 300° C. disposed in the gastight chamber illustrated in FIG. 1. A mixed gas of glycerol vapor and nitrogen (glycerol vapor:nitrogen mixing ratio=20% by volume: 80% by volume) was introduced into the gastight chamber through an inlet for gas 5, and with spraying the gas to the surface of the coating layer of the nanoparticle paste, heating was performed at 300° C. for 5 minutes in an atmosphere containing glycerol vapor having reducing ability (partial pressure of glycerol vapor: 200 hPa). With this heating process (first process) in a reducing atmosphere, the dispersion solvent contained in the coating layer is evaporated and the surface oxidation film of the fine copper oxide particles is reduced to give fine copper particles. The glycerol vapor/nitrogen mixed gas is introduced after diluting glycerol vapor at its equilibrium vapor pressure heated to 300° C. with nitrogen carrier gas to the aforementioned composition.

Then, with continuing heating at 300° C., the second process of repeating an oxidation/re-reduction cycle for five times comprising oxidizing the metal surface by spraying dry air (oxygen molecule:nitrogen molecule mixing ratio=20% by volume:80% by volume) to the surface for 10 seconds and re-reducing the metal surface by spraying the aforementioned glycerol vapor/nitrogen mixed gas to the surface instead of the dry air and maintaining the substrate in the atmosphere containing glycerol vapor having reducing ability for 2 minutes and 50 seconds was performed. After continuously performing the aforementioned first and second processes, with spraying the glycerol vapor/nitrogen mixed gas to the surface, the substrate was allowed to stand and cooled to room temperature. Moisture was beforehand removed from the aforementioned dry air.

Through the above series of processes, fine copper particles are reproduced by the reduction of fine copper oxide particles, and the reproduced fine copper particles are baked to form a conductor layer composed entirely of a sintered product layer of the fine copper particles.

The surface of the conductor layer pattern was glossy like a mirror surface and the layer had an average film thickness of 2 μm. The volume resistivity of the uniform conductor layer having the aforementioned average film thickness was measured to be 7.4 μΩ·cm. The resistivity of copper in bulk is 1.673 μΩ·cm (20° C.), and so the volume resistivity of the obtained sintered product layer of the copper nanoparticles was comparable to the resistivity of the copper in bulk.

Example 16

A copper oxide fine particle dispersion having a liquid viscosity appropriate for inkjet printing was prepared by the following procedure, using fine copper oxide particles in the form of a dry powder as a raw material.

In the fine copper oxide particles in the form of a dry powder prepared under the conditions of Example 3 used as a raw material, an amine compound containing a small amount of a secondary component, dodecylamine, in addition to the main component 2-ethylhexylamine remains as a surface covering layer for the fine copper particles having an average particle size of 5 nm and having an oxide film on the surface. In Example 16, since a dispersion in which the fine copper oxide particles in the form of a dry powder are uniformly dispersed in a mixture of dispersion solvents tetradecane and bis-2-ethylhexylamine is prepared with the covering layer of the amine compound being present on the surface, a re-dispersing process described below is employed.

To 370 g of the fine copper oxide particles in the form of a dry powder prepared under the condition of Example 3 were added 34.9 g of bis-2-ethylhexylamine (boiling point 263° C., available from Tokyo Chemical Industry, Co., Ltd.), 150.0 g of N14 (tetradecane, melting point 5.86° C., boiling point 253.57° C., available from JAPAN ENERGY CORPORATION) and 300 g of hexane, and the mixture was heated with stirring at 70° C. for 30 minutes. By this heating with stirring, copper oxide nanoparticles in the form of black fine powder are re-dispersed in a mixture containing tetradecane and bis-2-ethylhexylamine in hexane, forming a uniform dispersion. After completion of the stirring, the resultant is filtrated through a 0.2 μm membrane filter, and hexane in the filtrate is removed by vacuum concentration. Upon removal of the solvent hexane, a uniform greenish black nanoparticle dispersion in the form of high fluidity paste was obtained. The high fluidity paste-dispersion (copper oxide nanoparticle ink) had a liquid viscosity of 8 mPa·s (B-type rotation viscometer, measurement temperature: 20° C.). Referring to the entire composition of the nanoparticle ink, 254.9 parts by mass in total of organic components, i.e., 150.0 parts by mass of tetradecane which is the main dispersion solvent, 70.0 parts by mass of 2-ethylhexylamine and 34.9 parts by mass of bis-2-ethylhexylamine remained based on 300 parts by mass of the copper oxide nanoparticles which constitute a conductive medium. Accordingly, in this nanoparticle ink, the copper oxide nanoparticles which are the solid component have a volume ratio of 13.0% by volume and the organic components have a volume ratio of 87.0% by volume, the main dispersion solvent tetradecane amounting to 50.9% by volume thereof.

In other words, the obtained paste-dispersion is a dispersion of fine copper particles having an average particle size of 5 nm and having an oxide film on the surface, on the surface of which a 2-ethylhexylamine covering layer having an average thickness of 2.1 nm is formed, which are dispersed in a dispersion solvent (total: 62.1% by mass) of a mixture of N14 (tetradecane, density: 0.767 g/cm$^3$) and bis-2-ethylhexylamine (density: 0.805 g/cm$^3$) at a low density.

A 10×50 mm wide pattern was printed on a slide glass using the obtained nanoparticle ink by inkjet coating at an average film thickness upon coating of 20 μm by an inkjet printing method. After printing, by subjecting the copper oxide nanoparticle ink coating layer on the slide glass to the following process, the dispersion solvent contained in the fine copper oxide particle dispersion coating layer is evaporated and the surface of the fine copper oxide particles contained in the coating layer is reduced to convert to the corresponding copper particles, and the fine copper particles reproduced by the reduction are baked, whereby a conductor layer pattern composed of a sintered product layer of the copper nanoparticles is formed.

In the first process, the nanoparticle ink coating layer on the slide glass is placed face up at a pre-determined position on a hot plate pre-heated to 300° C. disposed in the gastight chamber illustrated in FIG. 1. When the slide glass is put on the pre-heated hot plate, the dispersion solvent contained in the dispersion is evaporated, and as a result, the fine copper oxide particles contained in the coating layer are closely stacked.

Then, a mixed gas of glycerol vapor and nitrogen (glycerol vapor:nitrogen mixing ratio=20% by volume: 80% by volume) was introduced into the gastight chamber through an inlet for gas 5, and with spraying the gas to the coating layer surface, heating was performed at 300° C. for 5 minutes in an atmosphere containing glycerol vapor having reducing ability (partial pressure of glycerol vapor: 200 hPa). With this heating process (first process) in a reducing atmosphere, a small amount of the dispersion solvent remaining in the coating layer is evaporated and at the same time, the surface oxidation film of the fine copper oxide particles is reduced to give fine copper particles. The glycerol vapor/nitrogen mixed gas is introduced after diluting glycerol vapor at its equilibrium vapor pressure heated to 300° C. with nitrogen carrier gas to the aforementioned composition.

Then, with continuing heating at 300° C., the second process of repeating an oxidation/re-reduction cycle for five times comprising oxidizing the metal surface by spraying dry air (oxygen molecule:nitrogen molecule mixing ratio=20% by volume:80% by volume) to the surface for 10 seconds and re-reducing the metal surface by spraying the aforementioned glycerol vapor/nitrogen mixed gas to the surface instead of the dry air and maintaining the substrate in the atmosphere containing glycerol vapor having reducing ability for 2 minutes and 50 seconds was performed. After continuously performing the aforementioned first and second processes, with spraying the glycerol vapor/nitrogen mixed gas to the surface, the substrate was allowed to stand and cooled to room temperature. Moisture was beforehand removed from the aforementioned dry air.

Through the above series of processes, fine copper particles are reproduced by the reduction of fine copper oxide particles, and the reproduced fine copper particles are baked to form a conductor layer composed entirely of a sintered product layer of the fine copper particles.

The surface of the conductor layer pattern obtained by the above processes was glossy like a mirror surface and the layer had an average film thickness of 2 μm. The volume resistivity of the uniform conductor layer having the aforementioned average film thickness was measured to be 6.1 μΩ·cm. The resistivity of copper in bulk is 1.673 μΩ·cm (20° C.), and so the volume resistivity of the obtained sintered product layer of the copper nanoparticles was comparable to the resistivity of the copper in bulk.

INDUSTRIAL APPLICABILITY

The present invention enables simple preparation of fine metal particles or fine metal oxide particles in the form of a dry powder which can be used as extremely fine particles in a good dispersion state without causing coagulation for a long time even if not stored in a dispersion solvent. The prepared fine metal particles or fine metal oxide particles in the form of a dry powder are, for example, formed into toner particles using a solid binder resin for toner, and a coated layer having a desired pattern is formed on a film-shaped substrate material surface using an electrophotographic image printing method, and then by performing a heating process, a sintered product conductor layer in which the contained fine metal particles or fine metal particles obtained by reducing fine metal oxide particles are sintered can be prepared. This process for forming a sintered product conductor layer using a dry printing method is useful for utilizing a sintered product conductor layer in which fine metal particles are sintered in a broader range of fields in addition to conventional methods of forming a sintered product conductor layer using a paste-dispersion by a wet printing method.

What is claimed is:

1. A process for preparing fine metal particles in the form of a dry powder, characterized in that the fine metal particles in the form of a dry powder are free from any solvent, an average particle size of the fine metal particles themselves are selected in the range of 1 to 20 nm, the surface of the fine metal particles themselves is covered with one or more compounds selected from the group consisting of diamine compounds having an alkyl substituent on one of two amino groups, hydroxyamine compounds having an O-alkyl substituent, and monoamines containing a branched alkyl group, which diamine compounds, hydroxyamine compounds and monoamines have a boiling point of from 150° C. to 300° C., a covering amount of said one or more compounds is adjusted by selecting the total of said one or more compounds in the range of 5 to 35 parts by mass based on 100 parts by mass of the fine metal particles themselves, and thus, the fine metal particles in the form of a dry powder are composed of the fine metal particles themselves and the one or more compounds; and as for the step of adjustment of the covering amount, the process comprises the steps of:

beforehand bringing said one or more compounds into contact with the surface of the fine metal particles themselves having an average particle size selected in the range of 1 to 20 nm, thereby once applying said one or more compounds through a coordinative bond with a metal element contained in the fine metal particles in an amount greater than the aimed covering amount in total of said one or more compounds based on 100 parts by mass of the fine metal particles themselves to form a covering layer thereof, and preparing, as a starting material, a dispersion in which the fine metal particles having a covering layer of said one or more compounds are dispersed in a dispersion solvent comprising one or more organic solvents, removing the organic solvent contained in the dispersion as a dispersion solvent under reduced pressure, thereby concentrating the dispersion, adding, to the dispersion subjected to the treatment for concentration, one or more polar solvents in which said one or more compounds exhibit a higher solubility at room temperature than that in the organic solvent, thereby dissolving excess of one or more compounds in said one or more polar solvents, and then separating fine metal particles in which the adjustment of the covering amount is attained by removing the excess of one or more compounds, as a solid phase component, from the obtained dispersion by filtration, and performing the treatment of evaporating the remaining one or more polar solvents at a temperature of 100° C. or lower to dry up, wherein a thickness of the covering layer formed with the adjusted covering amount is at least 0.5 nm or thicker, and selected in the range of $2/10$ to $8/10$ of the average particle size of the fine metal particles, and the one or more polar solvents are selected from the group consisting of alcohol solvents having a low boiling point of 80° C. or lower, ketone solvents having a low boiling point of 80° C. or lower and acetonitrile.

2. The process according to claim 1, characterized in that said fine metal particles themselves are fine metal particles of a metal species selected from the group consisting of gold, silver, copper, platinum, palladium, tin, nickel, aluminum, zirconium, titanium, iron and tungsten, or fine alloy particles comprising two or more metals selected from the metal species group.

3. The process according to claim 1, wherein said one or more compounds are selected from the group consisting of dibutylaminopropylamine, bis-(2-ethylhexyl)aminopropylamine, butoxypropylamine, 2-ethylhexyloxypropylamine, bls-z-ethylhexylarnlne and 2-ethylhexylamine.

4. A process for preparing fine metal particles in the form of a dry powder, characterized in that the fine metal particles in the form of a dry powder are free from any solvent, an average particle size of the fine metal particles themselves are selected in the range of 1 to 20 nm, the surface of the fine metal particles themselves is covered with one or more carboxylic acids selected from the group consisting of long chain carboxylic acids having 8 or more carbon atoms in the form of linear carboxylic acid, which carbon atoms are chosen in the range of 8 to 18 carbon atoms, a covering amount of said one or more carboxylic acids is adjusted by selecting the total of said one or more carboxylic acids in the range of 5 to 35 parts by mass based on 100 parts by mass of the fine metal particles themselves, and thus, the fine metal particles in the form of a dry powder are composed of the fine metal particles themselves and the one or more carboxylic acids; and as for the step of adjustment of the covering amount, the process comprises the steps of:

beforehand bringing said one or more compounds into contact with the surface of the fine metal particles themselves having an average particle size selected in the range of 1 to 20 nm, thereby once applying said one or more compounds through a coordinative bond with a metal element contained in the fine metal particles in an amount greater than the aimed covering amount in total of said one or more compounds based on 100 parts by mass of the fine metal particles themselves to form a covering layer thereof, and preparing, as a starting material, a dispersion in which the fine metal particles having a covering layer of said one or more compounds are dispersed in a dispersion solvent comprising one or more organic solvents, removing the organic solvent contained in the dispersion as a dispersion solvent under reduced pressure, thereby concentrating the dispersion, adding, to the dispersion subjected to the treatment for concentration, one or more polar solvents in which said one or more compounds exhibit a higher solubility at room temperature than that in the organic solvent, thereby dissolving excess of one or more compounds in said one or more polar solvents, and then separating fine metal particles in which the adjustment of the covering amount is attained by removing the excess of one or more compounds, as a solid phase component, from the obtained dispersion by filtration, and performing the treatment of evaporating the remaining one or more polar solvents at a temperature of 100° C. or lower to dry up, wherein the fine metal particles themselves are fine metal particles of a metal species selected from the group consisting of gold, silver, copper, platinum, palladium, tin, nickel, aluminum, zirconium, titanium, iron and tungsten, or fine alloy particles comprising two or more metals selected from the metal species group, a thickness of the covering layer formed with the adjusted covering amount is at least 0.5 nm or thicker, and selected in the range of $2/10$ to $8/10$ of the average particle size of the fine metal particles, and the one or more carboxylic acids are fixed by a coulombic interaction to the metal surface of the fine metal particles themselves to form the covering layer.

5. The process according to claim 4, wherein said one or more carboxylic acids are selected from the group consisting of lauric acid, myristic acid, palmitic acid and stearic acid.

* * * * *